US008000066B2

(12) United States Patent
Mizuno et al.

(10) Patent No.: US 8,000,066 B2
(45) Date of Patent: Aug. 16, 2011

(54) HARD DISK SYSTEM INCORPORATING A CURRENT PERPENDICULAR TO PLANE MAGNETO-RESISTIVE EFFECT DEVICE WITH A SPACER LAYER IN THE THICKNESS RANGE SHOWING CONDUCTION PERFORMANCE HALFWAY BETWEEN OHMIC CONDUCTION AND SEMI-CONDUCTIVE CONDUCTION

(75) Inventors: Tomohito Mizuno, Tokyo (JP); Yoshihiro Tsuchiya, Tokyo (JP); Kei Hirata, Tokyo (JP)

(73) Assignee: TDK Corporation, Tokyo (JP)

( * ) Notice: Subject to any disclaimer, the term of this patent is extended or adjusted under 35 U.S.C. 154(b) by 853 days.

(21) Appl. No.: 11/934,979

(22) Filed: Nov. 5, 2007

(65) Prior Publication Data

US 2008/0112096 A1    May 15, 2008

(30) Foreign Application Priority Data

Nov. 10, 2006 (JP) ................. 2006-304858

(51) Int. Cl.
*G11B 5/39* (2006.01)
(52) U.S. Cl. .................................. 360/324.2
(58) Field of Classification Search ....... 360/324–324.2; 365/145, 158, 171–173; 257/421–427; 428/810–816
See application file for complete search history.

(56) References Cited

U.S. PATENT DOCUMENTS 5,682,041 A * 10/1997 Kawakubo et al. ............ 257/38
6,333,067 B2 * 12/2001 Bojarczuk et al. ............ 427/130
6,347,049 B1 * 2/2002 Childress et al. ............. 365/173
7,606,010 B2 * 10/2009 Parkin ........................ 360/324.2
2006/0067017 A1   3/2006 Yuasa et al.
2008/0019060 A1   1/2008 Mizuno et al.
2008/0246023 A1 * 10/2008 Zeng et al. ..................... 257/25
2008/0278864 A1 * 11/2008 Zhang et al. .............. 360/324.12

FOREIGN PATENT DOCUMENTS

JP      2003-8102      1/2003

OTHER PUBLICATIONS

U.S. Appl. No. 11/626,562, filed Jan. 24, 2007, Hara, et al.
U.S. Appl. No. 11/757,174, filed Jun. 1, 2007, Tsuchiya, et al.
U.S. Appl. No. 11/768,435, filed Jun. 26, 2007, Tsuchiya, et al.
U.S. Appl. No. 11/865,384, filed Oct. 1, 2007, Hara, et al.
U.S. Appl. No. 11/870,097, filed Oct. 10, 2007, Shimazawa, et al.
U.S. Appl. No. 11/931,219, filed Oct. 31, 2007, Shimazawa, et al.
U.S. Appl. No. 11/968,911, filed Jan. 3, 2008, Tsuchiya, et al.
U.S. Appl. No. 12/128,352, filed May 28, 2008, Mizuno, et al.

* cited by examiner

*Primary Examiner* — A. J. Heinz
(74) *Attorney, Agent, or Firm* — Oblon, Spivak, McClelland, Maier & Neustadt, L.L.P.

(57) ABSTRACT

The thickness of the semiconductor layer forming a part of the spacer layer is set in the thickness range for a transitional area showing conduction performance halfway between ohmic conduction and semi-conductive conduction in relation to the junction of the semiconductor layer with the first nonmagnetic metal layer and the second nonmagnetic metal layer. This permits the specific resistance of the spacer layer to be greater than that of an ohmic conduction area, so that spin scattering and diffusion depending on a magnetized state increases, resulting in an increase in the MR ratio. The CPP-GMR device can also have a suitable area resistivity (AR) value. If the device can have a suitable area resistivity and a high MR ratio, it is then possible to obtain more stable output power in low current operation. The device is also lower in resistance than a TMR device, so that significant noise reductions are achievable.

22 Claims, 13 Drawing Sheets

Zn/ZnO/Zn

Cr/ZnO/Cr

Cu/ZnS/Cu

Ag/ZnS/Ag

Au/ZnS/Au

Cu/GaN/Cu

Ag/GaN/Ag

Au/GaN/Au

CuZn/GaN/CuZn

HARD DISK SYSTEM INCORPORATING A CURRENT PERPENDICULAR TO PLANE MAGNETO-RESISTIVE EFFECT DEVICE WITH A SPACER LAYER IN THE THICKNESS RANGE SHOWING CONDUCTION PERFORMANCE HALFWAY BETWEEN OHMIC CONDUCTION AND SEMI-CONDUCTIVE CONDUCTION

BACKGROUND OF THE INVENTION

1. Field of the Invention

The present invention relates to a magneto-resistive effect device for reading the magnetic field strength of a magnetic recording medium or the like as signals, a thin-film magnetic head comprising that magneto-resistive effect device, and a head gimbal assembly and a hard disk system comprising that thin-film magnetic head.

2. Explanation of the Prior Art

With recent improvements in the plane recording density of hard disk systems, there has been growing demands for improvements in the performance of thin-film magnetic heads. For the thin-film magnetic head, a composite type thin-film magnetic head has been widely used, which has a structure wherein a reproducing head having a read-only magneto-resistive effect device (hereinafter often referred to as the MR (magneto-resistive) device for short) and a recording head having a write-only induction type magnetic device are stacked together on a substrate.

For the MR device, there is the mention of an AMR device harnessing an anisotropic magneto-resistive effect, a GMR device harnessing a giant magneto-resistive effect, a TMR device harnessing a tunnel-type magneto-resistive effect, and so on.

The reproducing head is required to have high sensitivity and high outputs in particular. GMR heads using a spin valve type GMR device have already been mass-produced as a reproduction head possessing such performances, and to meet further improvements in plane recording densities, reproducing heads using TMR devices are now being mass-produced, too.

In general, the spin valve type GMR device comprises a nonmagnetic layer (also called the "spacer layer"), a free layer formed on one surface of that nonmagnetic layer, a fixed magnetization layer formed on another surface of the non-magnetic layer, and a pinned layer (generally an antiferro-magnetic layer) on the side of the fixed magnetization layer facing away from the nonmagnetic layer. The free layer has its magnetization direction changing depending on an external signal magnetic field, and the fixed magnetization layer has its magnetization direction fixed by a magnetic field from the pinned layer (anti-ferromagnetic layer).

By the way, common GMR heads used so far in the art have a CIP (current in plane) structure wherein a current for detecting magnetic signals (the so-called sense current) is passed parallel with the plane of each of the layers forming the GMR device (CIP-GMR device). On the other hand, GMR devices having the so-called CPP (current perpendicular to plane) structure wherein the sense current is passed perpendicularly to the plane of each of the layers forming the GMR device (CPP-GMR device), too, are now under development as next-generation ones.

The aforesaid TMR devices, too, would come under the CPP structure category according to a classification system from the current-passing direction alone. However, the multilayer construction and detection principle of the TMR device are different from those of the CPP-GMR device. That is, the TMR device generally comprises a free layer, a fixed magnetization layer, a tunnel barrier layer located between them, and an antiferromagnetic layer located on the plane of the fixed magnetization layer that faces away from its plane in contact with the tunnel barrier layer. The tunnel barrier layer is a nonmagnetic insulating layer through which electrons can pass in a state with spins reserved by the tunnel effect. The rest of the multilayer structure, i.e., the free layer, fixed magnetization layer and antiferromagnetic layer could be basically identical with those used with the spin valve type GMR device.

And now, when the TMR device is used for a reproducing head, it is required to have low resistance for the following reasons. For a magnetic disk system, there is a demand for improved recording density and improved data transfer rate, with which the reproducing head is required to have good high-frequency response. However, as the resistance value of the TMR device grows large, it will cause an increase in stray capacitances occurring at the TMR device and a circuit connected to it, rendering the high-frequency response of the reproducing head worse. This is the reason the TMR device must inevitably have low resistance.

Generally speaking, reducing the thickness of the tunnel barrier layer would work for making the resistance of the TMR device low. However, too thin a tunnel barrier layer would cause a lot more pinholes to occur in the tunnel barrier layer, rendering the service life of the TMR device short. Further, there would be a magnetic couple produced between the free layer and the fixed magnetization layer, ending up with problems: a lot more noise, a drop of the MR ratio, and degradation of TMR device's performance. The noise occurring at the reproducing head is here called head noise. The head noise occurring at the reproducing head using the TMR device includes shot noise, a noise component that is unlikely to occur at a reproducing head using the GMR device. Thus, a problem with the reproducing head using the TMR device is that the head noise is noticeable.

With the CPP-GMR device, on the other hand, there is a problem that no large enough MR ratio is obtained. A reason for this could be that asymmetry per spin of electrical resistance upon the spin-dependent scattering of the magnetic material and Cu is less than that of the electrical resistance of tunnel electrons. Another, spillover possible reason could be that spin-polarized electrons are scattered at the interface between the nonmagnetic electroconductive layer and the magnetic layer, and in the nonmagnetic electroconductive layer.

Also, the CPP-GMR device, because of having a small resistance value, is low in terms of the amount of resistance change. For this reason, in order to obtain large reproduction output with the CPP-GMR device, high voltage must be applied to that device. However, the application of high voltage to the device offers such problems as described below. With the CPP-GMR device, currents are passed in a direction perpendicular to the plane of each layer, whereupon spin-polarized electrons are poured from the free layer into the fixed magnetization layer or from the fixed magnetization layer into the free layer. Such spin-polarized electrons cause torque (hereinafter called the spin torque) that rotates those magnetizations to be generated at the free layer or the fixed magnetization layer. The magnitude of this spin torque is proportional to the current density. As the voltage applied to the CPP-GMR device grows high, it causes the current density to grow large with the result that there is large spin torque. As the spin torque increases, there are problems such as changes in the direction of magnetization of the fixed magnetization layer, and the inability of the free layer to freely change the direction of magnetization with respect to an external magnetic field. Further, operation at high current densities offers another problem: a considerable shortening of service life due to electromigration.

Note here that the prior art that seems to be most relevant to the invention of this application is JP-A-2003-8102. This prior art sets forth a CPP-GMR device comprising a fixed magnetization layer having a fixed magnetization direction, a free magnetization layer with its magnetization direction changing depending on an external magnetic field, a nonmagnetic metal intermediate layer interposed between the fixed magnetization layer and the free magnetization layer, and a resistance control layer interleaved between the fixed magnetization layer and the free magnetization layer and formed of a material having conduction carriers of up to $10^{22}/cm^3$. The prior art shows a semiconductor as one of resistance control layer materials; however, it does not suggest at al about the requirements for the invention of this application.

In view of such situations as described above, an object of the invention is to provide a CPP-GMR device that is capable of achieving large MR ratios while holding back noises and the influences of spin torque.

SUMMARY OF THE INVENTION

According to the present invention, the aforesaid object is achievable by the provision of a giant magneto-resistive effect device (CPP-GMR device) having a CPP (current perpendicular to plane) structure comprising a spacer layer, and a fixed magnetization layer and a free layer stacked one upon another with said spacer layer interposed between them, with a sense current applied in a stacking direction, wherein said free layer functions such that its magnetization direction changes depending on an external magnetic field, and said spacer layer comprises a first nonmagnetic metal layer and a second nonmagnetic metal layer, each formed of a nonmagnetic metal material, and a semiconductor layer interposed between the first nonmagnetic metal layer and the second nonmagnetic metal layer, wherein the thickness of the semiconductor layer forming a part of said spacer layer is set in the thickness range for a transitional area showing conduction performance halfway between ohmic conduction and semiconductive conduction in relation to the junction of said semiconductor layer with said first nonmagnetic metal layer and said second nonmagnetic metal layer.

In a preferable embodiment of the magneto-resistive effect device of the invention, said semiconductor layer is ZnO, and said first nonmagnetic metal layer and said second nonmagnetic metal layer are each Zn, wherein said ZnO semiconductor layer has a thickness of 1.0 to 1.6 nm.

In a preferable embodiment of the magneto-resistive effect device of the invention, said semiconductor layer is ZnO, and said first nonmagnetic metal layer and said second nonmagnetic metal layer are each Ti, wherein said ZnO semiconductor layer has a thickness of 0.8 to 1.2 nm.

In a preferable embodiment of the magneto-resistive effect device of the invention, said semiconductor layer is ZnO, and said first nonmagnetic metal layer and said second nonmagnetic metal layer are each V, wherein said ZnO semiconductor layer has a thickness of 1.2 to 1.6 nm.

In a preferable embodiment of the magneto-resistive effect device of the invention, said semiconductor layer is ZnO, and said first nonmagnetic metal layer and first nonmagnetic metal layer are each Cr, wherein said ZnO semiconductor layer has a thickness of 1.6 to 2.0 nm.

In a preferable embodiment of the magneto-resistive effect device of the invention, said semiconductor layer is ZnS, and said first nonmagnetic metal layer and said second nonmagnetic metal layer are each Cu, wherein said ZnS semiconductor layer has a thickness of 1.2 to 1.6 nm.

In a preferable embodiment of the magneto-resistive effect device of the invention, said semiconductor layer is ZnS, and said first nonmagnetic metal layer and said second nonmagnetic metal layer are each Ag, wherein said ZnS semiconductor layer has a thickness of 1.0 to 1.4 nm.

In a preferable embodiment of the magneto-resistive effect device of the invention, said semiconductor layer is ZnS, and said first nonmagnetic metal layer and said second nonmagnetic metal layer are each Au, wherein said ZnS semiconductor layer has a thickness of 1.2 to 1.6 nm.

In a preferable embodiment of the magneto-resistive effect device of the invention, said semiconductor layer is ZnS, and said first nonmagnetic metal layer and said second nonmagnetic metal layer are each CuZn, wherein said ZnS semiconductor layer has a thickness of 1.2 to 1.6 nm.

In a preferable embodiment of the magneto-resistive effect device of the invention, said semiconductor layer is ZnS, and said first nonmagnetic metal layer and said second nonmagnetic metal layer are each Zn, wherein said ZnS semiconductor layer has a thickness of 1.6 to 2.0 nm.

In a preferable embodiment of the magneto-resistive effect device of the invention, said semiconductor layer is GaN, and said first nonmagnetic metal layer and said second nonmagnetic metal layer are each Cu, wherein said GaN semiconductor layer has a thickness of 1.2 to 1.6 nm.

In a preferable embodiment of the magneto-resistive effect device of the invention, said semiconductor layer is GaN, and said first nonmagnetic metal layer and said second nonmagnetic metal layer are each Ag, wherein said GaN semiconductor layer has a thickness of 1.0 to 1.4 nm.

In a preferable embodiment of the magneto-resistive effect device of the invention, said semiconductor layer is GaN, and said first nonmagnetic metal layer and said second nonmagnetic metal layer are each Au, wherein said GaN semiconductor layer has a thickness of 0.8 to 1.2 nm.

In a preferable embodiment of the magneto-resistive effect device of the invention, said semiconductor layer is GaN, and said first nonmagnetic metal layer and said second nonmagnetic metal layer are each CuZn, wherein said GaN semiconductor layer has a thickness of 1.2 to 1.6 nm.

In a preferable embodiment of the magneto-resistive effect device of the invention, said semiconductor layer is GaN, and said first nonmagnetic metal layer and said second nonmagnetic metal layer are each Zn, wherein said GaN semiconductor layer has a thickness of 1.6 to 2.0 nm.

In a preferable embodiment of the magneto-resistive effect device of the invention, said first nonmagnetic metal layer, and said second nonmagnetic metal layer has a thickness of 0.15 to 0.85 nm.

In a preferable embodiment of the magneto-resistive effect device of the invention, said first nonmagnetic metal layer, and said second nonmagnetic metal layer has a thickness of 0.25 to 0.70 nm.

In a preferable embodiment of the magneto-resistive effect device of the invention, the magneto-resistive effect device has an area resistivity of 0.1 to 0.3 $\Omega \cdot \mu m^2$.

In a preferable embodiment of the magneto-resistive effect device of the invention, said spacer layer has an electroconductivity of 133 to 432 (S/cm).

The invention also provides a thin-film magnetic head, comprising a plane opposite to a recoding medium, the aforesaid magneto-resistive effect device, which is located near said medium opposite plane for detecting a signal magnetic field from said recording medium, and a pair of electrodes for passing currents in the stacking direction of said magneto-resistive effect device.

Further, the invention provides a head gimbal assembly, comprising a slider including the aforesaid thin-film magnetic head and located in opposition to a recording medium, and a suspension adapted to resiliently support said slider.

Further, the invention provides a hard disk system, comprising a slider including the aforesaid thin-film magnetic head and located in opposition to a recording medium, and a positioning means adapted to support and position said slider with respect to said recording medium.

As described above, the invention provides a giant magneto-resistive effect device (CPP-GMR device) having a CPP (current perpendicular to plane) structure comprising a spacer layer, and a fixed magnetization layer and a free layer stacked one upon another with said spacer layer interposed between them, with a sense current applied in a stacking direction, wherein said free layer functions such that the magnetization direction changes depending on an external magnetic field, and said spacer layer comprises a first nonmagnetic metal layer and a second nonmagnetic metal layer, each formed of a nonmagnetic metal material, and a semiconductor layer interposed between the first nonmagnetic metal layer and the second nonmagnetic metal layer, wherein the thickness of the semiconductor layer forming a part of said spacer layer is set in the thickness range for a transitional area showing conduction performance halfway between ohmic conduction and semi-conductive conduction in relation to the junction of said semiconductor layer with said first nonmagnetic metal layer and said second nonmagnetic metal layer. This permits the specific resistance of the spacer layer to be greater than that of an ohomic conduction area, so that spin scattering and diffusion depending on a magnetized state increases, resulting in an increase in the MR ratio. The CPP-GMR device can also have a suitable area resistivity (AR) value.

If the device can have a suitable area resistivity and a high MR ratio, it is then possible to obtain more stable output power in low current operation than ever before, and extend the service life of the device. The device is also lower in resistance than a TMR device, so that significant noise reductions are achievable.

EXPLANATION OF THE PREFERRED EMBODIMENTS

The best mode for carrying out the invention is now explained in details.

Figure 1:
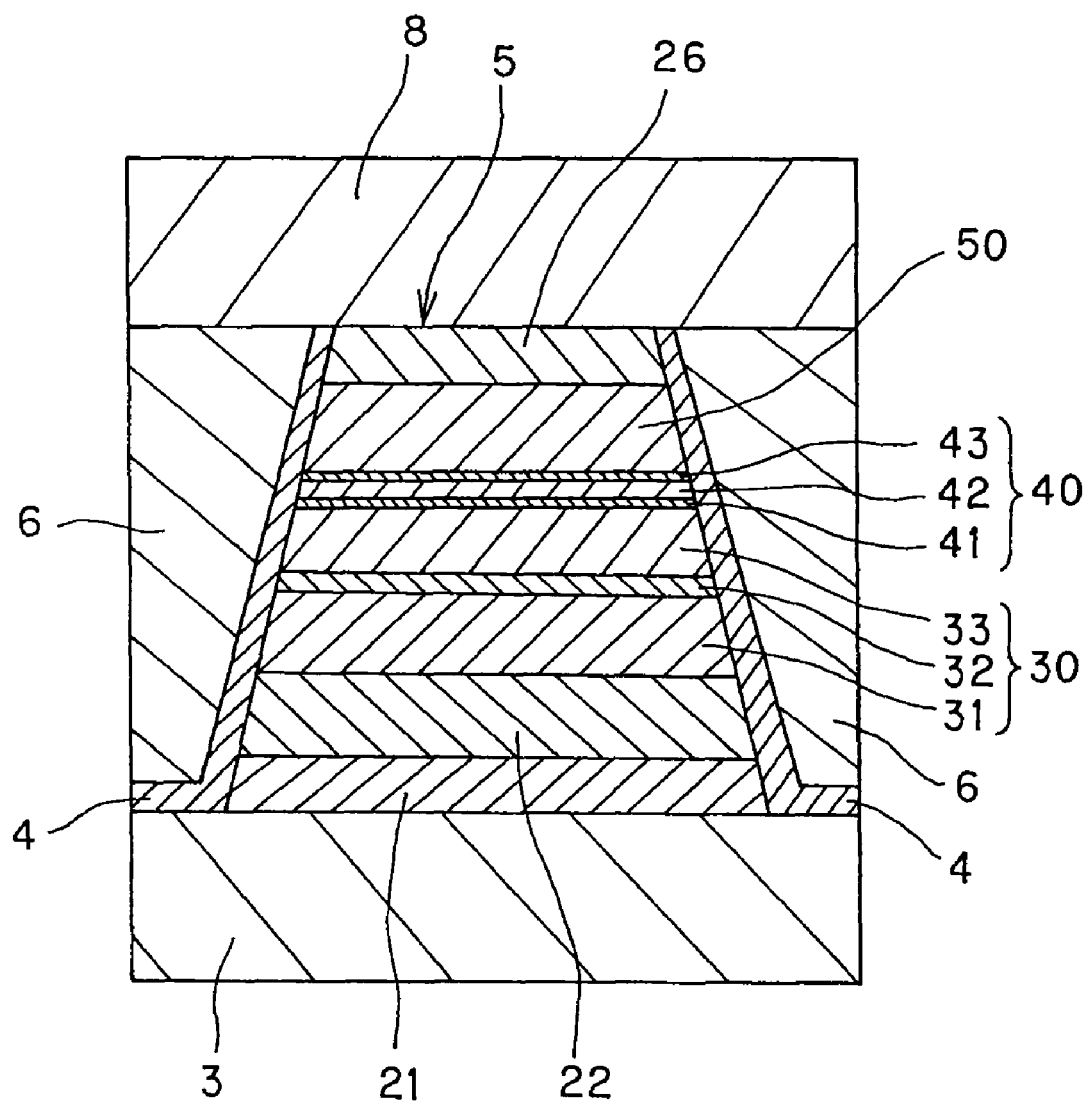
FIG. 1 is a sectional view illustrative of a section of an embodiment of the invention primarily parallel with the plane of a reproducing head in opposition to a medium.

FIG. 1 is illustrative of the ABS (air bearing surface) of the reproducing head in an embodiment of the invention; FIG. 1 is illustrative in schematic of the ABS of the giant magneto-resistive effect device (CPP-GMR device) having a CPP structure—part of the invention. The ABS is generally corresponding to a plane (hereinafter often called the medium opposite plane) at which a reproducing head is in opposition to a recording medium; however, it is understood that the ABS here includes even a section at a position where the multilayer structure of the device can be clearly observed. For instance, a protective layer of DLC (the protective layer adapted to cover the device) or the like, in a strict sense, positioned facing the medium opposite plane may be factored out, if necessary.

Figure 2:
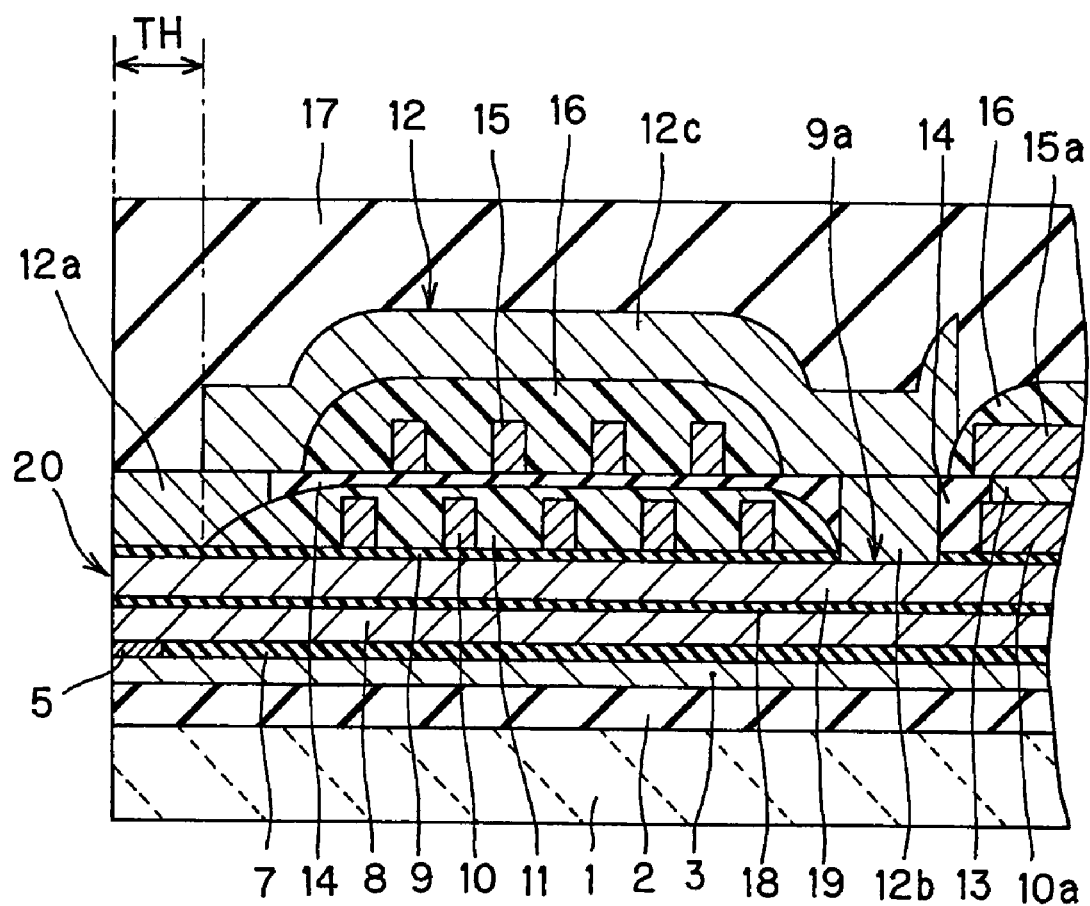
FIG. 2 is illustrative of the construction of a thin-film magnetic head according to one preferable embodiment of the invention; it is a sectional view illustrative of the plane of the thin-film magnetic head in opposition to the medium and a section thereof perpendicular to a substrate.

FIG. 2 is illustrative of the construction of the thin-film magnetic head according to one preferable embodiment of the invention; it is a sectional view illustrative of a section of the thin-film magnetic head perpendicular to the ABS and substrate.

Figure 3:
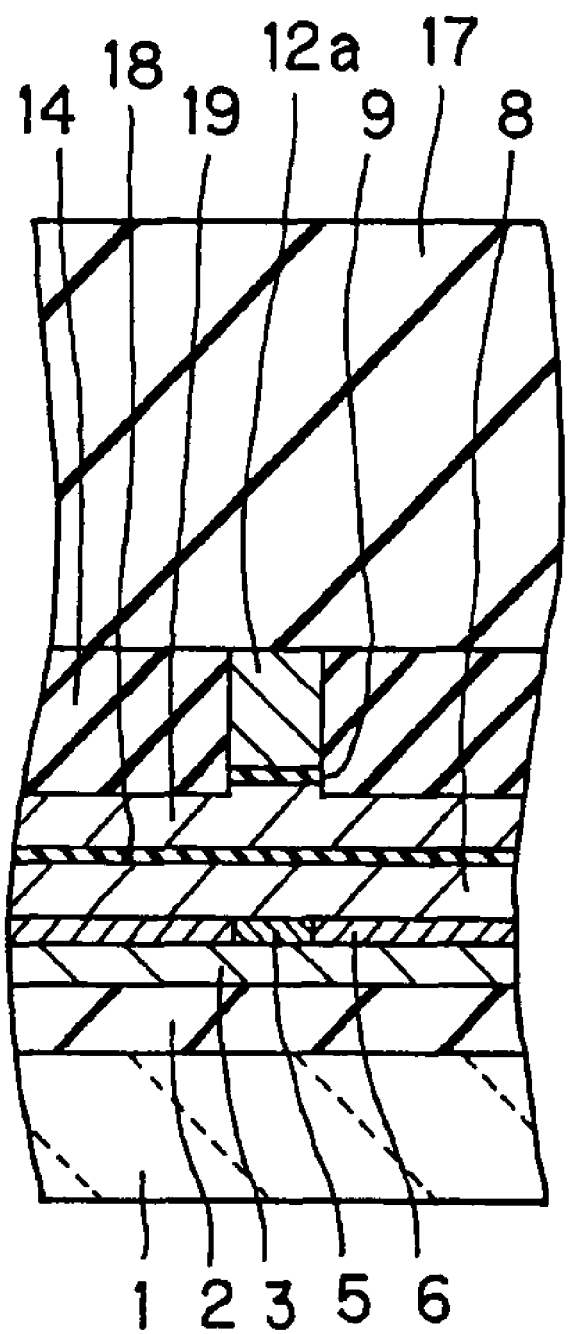
FIG. 3 is illustrative of the construction of the thin-film magnetic head according to one preferable embodiment of the invention; it is a sectional view illustrative of a section of a magnetic pole portion of the thin-film magnetic head parallel with the medium opposite plane.

FIG. 3 is illustrative of the construction of the thin-film magnetic head according to one preferable embodiment of the invention; it is a sectional view illustrative of a section of a magnetic pole portion of the thin-film magnetic head parallel with the ABS in particular.

Figure 4:
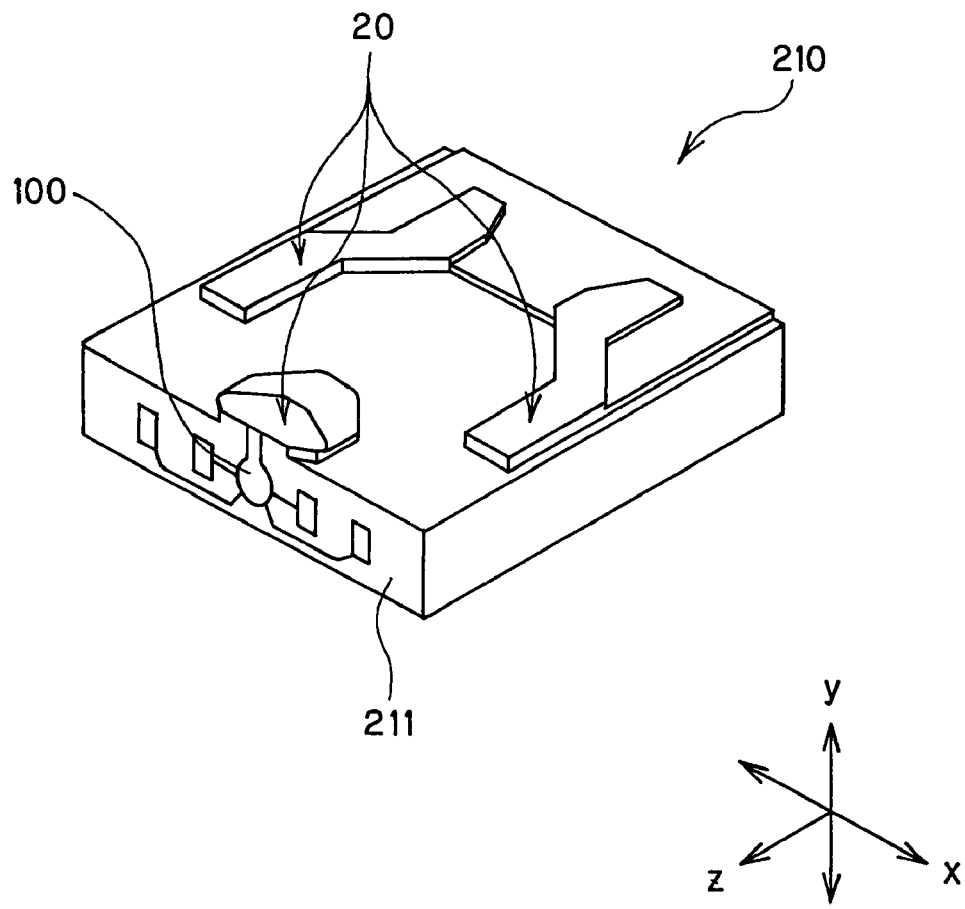
FIG. 4 is a perspective view of a slider included in the head gimbal assembly according to one embodiment of the invention.
Figure 5:
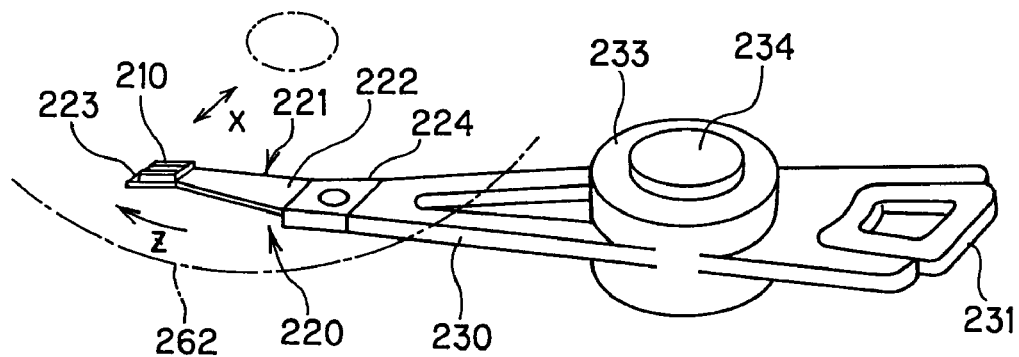
FIG. 5 is a perspective view of a head arm assembly including the head gimbal assembly according to one embodiment of the invention.
Figure 6:
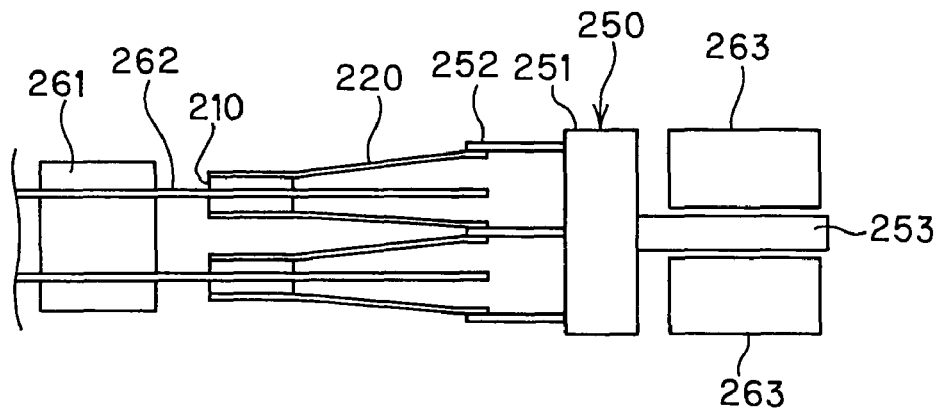
FIG. 6 is illustrative of part of the hard disk system according to one embodiment of the invention.
Figure 7:
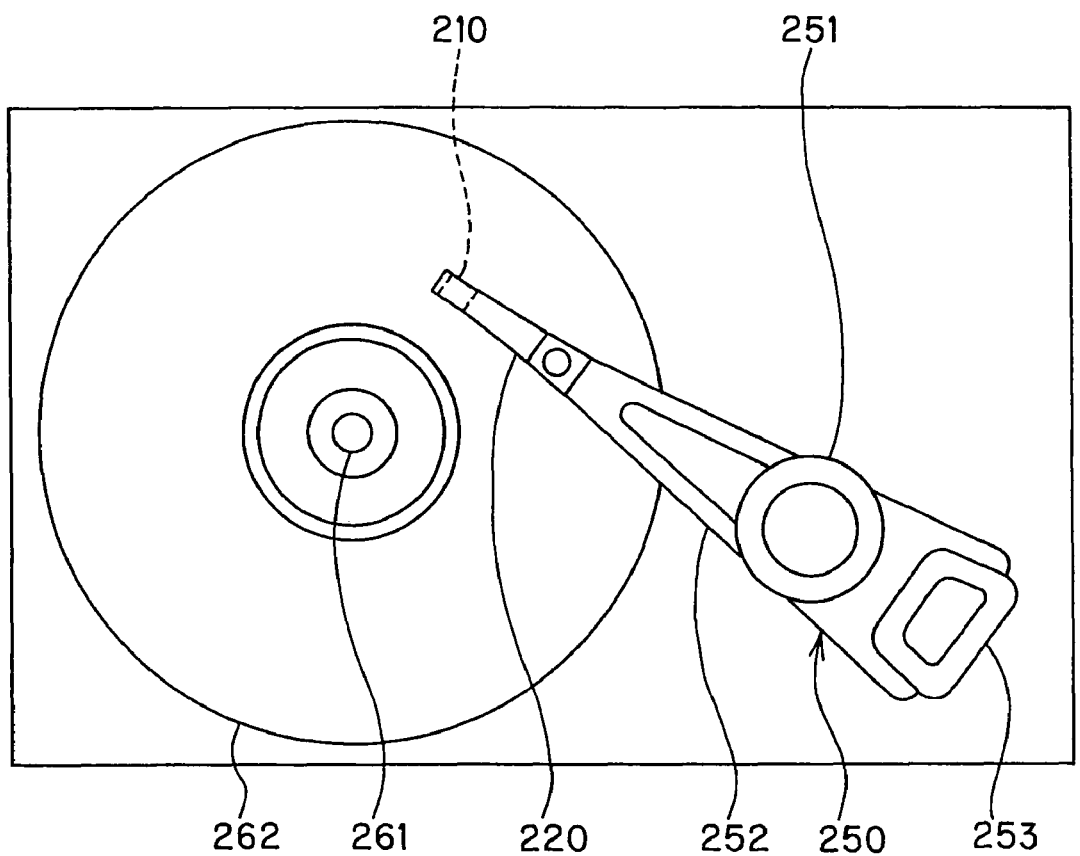
FIG. 7 is a plan view of the hard disk system according to one embodiment of the invention.

FIG. 4 is a perspective view of a slider included in the head gimbal assembly according to one embodiment of the invention; FIG. 5 is a perspective view of a head arm assembly including the head gimbal assembly according to one embodiment of the invention; FIG. 6 is illustrative of part of the hard disk system according to one embodiment of the invention; and FIG. 7 is a plan view of the hard disk system according to one embodiment of the invention.

[Giant Magneto-Resistive Effect Device (CPP-GMR Device) Having a CPP Structure]

The construction of a reproducing head comprising the inventive giant magneto-resistive effect device (CPP-GMR device) having a CPP structure is now explained in details with reference to FIG. 1.

As noted above, FIG. 1 is a sectional view corresponding to a section of the reproducing head parallel with the medium opposite plane.

As shown in FIG. 1, the reproducing head according to the embodiment here comprises a first shield layer 3 and a second shield layer 8 that are located at a given space and opposed vertically on the paper, a giant magneto-resistive effect device 5 (hereinafter referred to as the GMR device 5) interposed between the first shield layer 3 and the second shield layer 8, an insulating film 4 adapted to cover two sides of the GMR device 5 and a part of the upper surface of the first shield layer 3 along these sides, and two bias magnetic field-applying layers 6 adjacent to the two sides of the GMR device 5 via the insulating layer 4.

In the embodiment here, the first 3 and the second shield layer 8 take a so-called magnetic shield role plus a pair-of-electrodes role. In other words, they have not only a function of shielding magnetism but also function as a pair of electrodes adapted to pass the sense current through the GMR device in a direction intersecting the plane of each of the layers forming the GMR device 5, for instance, in the direction perpendicular to the plane of each of the layers forming the GMR device (stacking direction).

Apart from the first 3 and the second shield layer 8, another pair of electrodes may be additionally provided above and below the GMR device.

The reproducing head of the invention includes the GMR device 5 having a CPP structure—part of the invention.

Referring to the inventive GMR device 5 having a CPP structure in terms of a broad, easy-to-understand concept, it comprises a spacer layer 40, and a fixed magnetization layer 30 and a free layer 50 that are stacked one upon another with the spacer layer 40 held between them, as shown in FIG. 1. And then, the sense current is applied to the GMR device 5 in its stacking direction to enable its function. In short, there is the GMR device 5 having a CPP (current perpendicular to plane) involved.

The free layer 50 has its magnetization direction changing dependent on an external magnetic field, viz., a signal magnetic field from a recording medium, while the fixed magnetization layer 30 has its magnetization direction fixed under the action of an antiferromagnetic layer 22. While an embodiment with the antiferromagnetic layer 22 formed on a bottom side (the side of the first shield layer 3) is shown in FIG. 1, it is contemplated that the antiferromagnetic layer 22 may just as well be formed on a top side (the side of the second shield layer 8) to interchange the free layer 50 and the fixed magnetization layer 30 in position.

(Explanation of the Fixed Magnetization Layer 30)

In the invention, the fixed magnetization layer 30 is formed on the antiferromagnetic layer 22 having a pinning action via an underlay layer 21 formed on the first shield layer 3.

In a preferable embodiment of the invention, the fixed magnetization layer 30 has a so-called synthetic pinned layer comprising, in order from the side of the antiferromagnetic layer 22, an outer layer 31, a non-magnetic intermediate layer 32 and an inner layer 33, all stacked together in order.

The outer layer 31, and the inner layer 33 is provided by a ferromagnetic layer made of, for instance, a ferromagnetic material containing Co, and Fe. The outer 31 and the inner layer 32 are antiferromagnetically coupled together and fixed such that their magnetization directions are opposite to each other.

The outer 31, and the inner layer 33 is preferably made of, for instance, a $Co_{70}Fe_{30}$ (at %) alloy. The outer layer has a thickness of preferably about 3 to 7 nm, and the inner layer 33 has a thickness of preferably about 3 to 10 nm. The inner layer 33 may also contain a Heusler alloy layer.

For instance, the nonmagnetic intermediate layer 32 is made of a nonmagnetic material containing at least one selected from the group consisting of Rh, Rh, Ir, Re, Cr, Zr and Cu, and has a thickness of, for instance, about 0.35 to 1.0 nm. The nonmagnetic intermediate layer 32 is provided to fix the magnetization of the inner layer 33 and the magnetization of the outer layer 31 in mutually opposite directions. The phrase "magnetization in mutually opposite directions" stands for a broad concept that encompasses just only two such magnetizations in just opposite directions of 180° but also those in different directions of 180°±20° as well.

(Explanation of the Free Layer 50)

The free layer 50 has its magnetization direction changing depending on an external magnetic field, i.e., a signal magnetic field from the recording medium, and is made of a ferromagnetic layer (soft magnetic layer) having a small coercive force. The free layer 50 has a thickness of, for instance, about 2 to 10 nm, and may be in either a single layer form or a multilayer form including a plurality of ferromagnetic layers. The free layer 50 may also contain a Heusler alloy layer.

On such free layer 50, there is a protective layer 26 formed, which comprises a Ta or Ru layer as an example, as shown in FIG. 1. The protective layer 26 has a thickness of about 0.5 to 20 nm.

(Explanation of the Spacer Layer 40)

In the invention, the spacer layer 40 is built up of the first nonmagnetic metal layer 41 and the second nonmagnetic metal layer 43 with a semiconductor layer 42 interposed between the first 41 and the second nonmagnetic metal layer 43.

More specifically, there is a triple-layer structure involved, in which the first nonmagnetic metal layer 41/semiconductor layer 42/second nonmagnetic metal layer 43 are stacked together in order. In the embodiment here, the first nonmagnetic metal layer 41 is positioned on the side of the fixed magnetization layer 30 and the second nonmagnetic metal layer 43 is positioned on the side of the free layer 50, as shown in FIG. 1, and as described below in details.

Multilayer Setup of the 1st Nonmagnetic Metal Layer 41/Semiconductor Layer 42/2nd Nonmagnetic Metal Layer 43

The thickness of the semiconductor layer 42 forming part of the spacer layer 40 in the invention is set in the thickness range for a transitional area showing conduction performance halfway between ohmic conduction and semi-conductive conduction in relation to the junction of that semiconductor layer 42 with the first 41 and the second nonmagnetic metal layer 43. In other words, only the transitional area of the metal/semiconductor junction interface that lies between ohmic contact and semi-conductive conduction is used. Conduction through that transitional area makes sure the specific resistance of the spacer grows higher than could be achieved with ordinary ohmic conduction so that there is an increased spin-depending scattering depending on a magnetized state, resulting in increasing MR ratios.

For how to find a semiconductor thickness area showing conduction performance halfway between ohmic conduction and semi-conductive conduction, see what will be described in the experimental examples given later.

The semiconductor material forming the semiconductor layer 42 should preferably be one having a band gap of 3 eV to 4 eV inclusive. At less than 3 eV, a film making sure film quality becomes impractically thin. At greater than 4 eV, on the other hand, insulative nature begins to come out, making the function of the CPP device vanish off.

Further, the incorporation of a magnetic metal in the semiconductor layer 42 is not preferable because of creating a scattering level that disturbs spins in a non-magnetic state. To keep this out, there are the first 41 and the second nonmagnetic metal layer 43 located at a site contiguous to the fixed magnetization layer 30 and free layer 50, which allow the spacer 40 to assume on a configuration having both sides of the semiconductor layer 42 held between the first 41 and the second nonmagnetic metal layer 43.

Preferable specific multilayer setups of the first nonmagnetic metal layer 41/semiconductor layer 42/second nonmagnetic metal layer 43 are now described in greater details.

(1) Embodiment Wherein the Material of the Semiconductor Layer 42 is ZnO (1-1) The first 41 and the second nonmagnetic metal layer 43 is each made of Zn so that the spacer layer 40 is made up of Zn/ZnO/Zn.

Then, the thickness of the ZnO semiconductor layer showing conduction performance between ohmic conduction and semi-conductive conduction should be 1.0 to 1.6 nm. As that thickness exceeds 1.6 nm, it causes the semiconductor layer to have semi-conductive conduction, giving rise to inconvenience: too large specific resistance. As that thickness is short of 1.0 nm, it causes the semiconductor layer to have ohmic conduction, failing to make improvements in specific resistance and, consequently, giving rise to inconvenience: any increase in the device area resistivity AR is not expectable.

(1-2) The first 41 and the second nonmagnetic metal layer 43 is each made of Ti so that the spacer layer 40 is made up of Ti/ZnO/Ti.

Then, the thickness of the ZnO semiconductor layer showing conduction performance between ohmic conduction and semi-conductive conduction should be 0.8 to 1.2 nm. As that thickness exceeds 1.2 nm, it causes the semiconductor layer to have semi-conductive conduction, giving rise to inconvenience: too large specific resistance. As that thickness is short of 0.8 nm, it causes the semiconductor layer to have ohmic conduction, failing to make improvements in specific resistance and, consequently, giving rise to inconvenience: any increase in the device area resistivity AR is not expectable.

(1-3) The first 41 and the second nonmagnetic metal layer 43 is each made of V so that the spacer layer 40 is made up of V/ZnO/V.

Then, the thickness of the ZnO semiconductor layer showing conduction performance between ohmic conduction and semi-conductive conduction should be 1.2 to 1.6 nm. As that thickness exceeds 1.6 nm, it causes the semiconductor layer to have semi-conductive conduction, giving rise to inconvenience: too large specific resistance. As that thickness is short of 1.2 nm, it causes the semiconductor layer to have ohmic conduction, failing to make improvements in specific resistance and, consequently, giving rise to inconvenience: any increase in the device area resistivity AR is not expectable.

(1-4) The first 41 and the second nonmagnetic metal layer 43 is each made of Cr so that the spacer layer 40 is made up of Cr/ZnO/Cr.

Then, the thickness of the ZnO semiconductor layer showing conduction performance between ohmic conduction and semi-conductive conduction should be 1.6 to 2.0 nm. As that thickness exceeds 2.0 nm, it causes the semiconductor layer to have semi-conductive conduction, giving rise to inconvenience: too large specific resistance. As that thickness is short of 1.6 nm, it causes the semiconductor layer to have ohmic conduction, failing to make improvements in specific resistance and, consequently, giving rise to inconvenience: any increase in the device area resistivity AR is not expectable.

(2) Embodiment Wherein the Material of the Semiconductor Layer 42 is ZnS (2-1) The first 41 and the second nonmagnetic metal layer 43 is each made of Cu so that the spacer layer 40 is made up of Cu/ZnS/Cu.

Then, the thickness of the ZnS semiconductor layer showing conduction performance between ohmic conduction and semi-conductive conduction should be 1.2 to 1.6 nm. As that thickness exceeds 1.6 nm, it causes the semiconductor layer to have semi-conductive conduction, giving rise to inconvenience: too large specific resistance. As that thickness is short of 1.2 nm, it causes the semiconductor layer to have ohmic conduction, failing to make improvements in specific resistance and, consequently, giving rise to inconvenience: any increase in the device area resistivity AR is not expectable.

(2-2) The first 41 and the second nonmagnetic metal layer 43 is each made of Ag so that the spacer layer 40 is made up of Ag/ZnS/Ag.

Then, the thickness of the ZnS semiconductor layer showing conduction performance between ohmic conduction and semiconductive conduction should be 1.0 to 1.4 nm. As that thickness exceeds 1.4 nm, it causes the semiconductor layer to have semi-conductive conduction, giving rise to inconvenience: too large specific resistance. As that thickness is short of 1.0 nm, it causes the semiconductor layer to have ohmic conduction, failing to make improvements in specific resistance and, consequently, giving rise to inconvenience: any increase in the device area resistivity AR is not expectable.

(2-3) The first 41 and the second nonmagnetic metal layer 43 is each made of Au so that the spacer layer 40 is made up of Au/ZnS/Au.

Then, the thickness of the ZnS semiconductor layer showing conduction performance between ohmic conduction and semi-conductive conduction should be 1.2 to 1.6 nm. As that thickness exceeds 1.6 nm, it causes the semiconductor layer to have semi-conductive conduction, giving rise to inconvenience: too large specific resistance. As that thickness is short of 1.2 nm, it causes the semiconductor layer to have ohmic conduction, failing to make improvements in specific resistance and, consequently, giving rise to inconvenience: any increase in the device area resistivity AR is not expectable.

(2-4) The first 41 and the second nonmagnetic metal layer 43 is each made of a CuZn alloy so that the spacer layer 40 is made up of CuZn/ZnS/CuZn. The content of Cu in the CuZn alloy should be 40 to 60 at %.

Then, the thickness of the ZnS semiconductor layer showing conduction performance between ohmic conduction and semi-conductive conduction should be 1.6 to 2.0 nm. As that thickness exceeds 2.0 nm, it causes the semiconductor layer to have semi-conductive conduction, giving rise to inconvenience: too large specific resistance. As that thickness is short of 1.6 nm, it causes the semiconductor layer to have ohmic conduction, failing to make improvements in specific resistance and, consequently, giving rise to inconvenience: any increase in the device area resistivity AR is not expectable.

(2-5) The first 41 and the second nonmagnetic metal layer 43 is each made of Zn so that the spacer layer 40 is made up of Zn/ZnS/Zn.

Then, the thickness of the ZnS semiconductor layer showing conduction performance between ohmic conduction and semi-conductive conduction should be 1.6 to 2.0 nm. As that thickness exceeds 2.0 nm, it causes the semiconductor layer to have semi-conductive conduction, giving rise to inconvenience: too large specific resistance. As that thickness is short of 1.6 nm, it causes the semiconductor layer to have ohmic conduction, failing to make improvements in specific resistance and, consequently, giving rise to inconvenience: any increase in the device area resistivity AR is not expectable.

(3) Embodiment Wherein the Material of the Semiconductor Layer 42 is GaN (3-1) The first 41 and the second nonmagnetic metal layer 43 is each made of Cu so that the spacer layer 40 is made up of Cu/GaN/Cu.

Then, the thickness of the GaN semiconductor layer showing conduction performance between ohmic conduction and semi-conductive conduction should be 1.2 to 1.6 nm. As that thickness exceeds 1.6 nm, it causes the semiconductor layer to have semi-conductive conduction, giving rise to inconvenience: too large specific resistance. As that thickness is short of 1.2 nm, it causes the semiconductor layer to have ohmic conduction, failing to make improvements in specific resistance and, consequently, giving rise to inconvenience: any increase in the device area resistivity AR is not expectable.

(3-2) The first 41 and the second nonmagnetic metal layer 43 is each made of Ag so that the spacer layer 40 is made up of Ag/GaN/Ag.

Then, the thickness of the GaN semiconductor layer showing conduction performance between ohmic conduction and semi-conductive conduction should be 1.0 to 1.4 nm. As that thickness exceeds 1.4 nm, it causes the semiconductor layer to have semi-conductive conduction, giving rise to inconvenience: too large specific resistance. As that thickness is short of 1.0 nm, it causes the semiconductor layer to have ohmic conduction, failing to make improvements in specific resistance and, consequently, giving rise to inconvenience: any increase in the device area resistivity AR is not expectable.

(3-3) The first 41 and the second nonmagnetic metal layer 43 is each made of Au so that the spacer layer 40 is made up of Au/GaN/Au.

Then, the thickness of the GaN semiconductor layer showing conduction performance between ohmic conduction and semiconductive conduction should be 0.8 to 1.2 nm. As that thickness exceeds 1.2 nm, it causes the semiconductor layer to have semi-conductive conduction, giving rise to inconvenience: too large specific resistance. As that thickness is short of 0.8 nm, it causes the semiconductor layer to have ohmic conduction, failing to make improvements in specific resistance and, consequently, giving rise to inconvenience: any increase in the device area resistivity AR is not expectable.

(3-4) The first 41 and the second nonmagnetic metal layer 43 is each made of a CuZn alloy so that the spacer layer 40 is made up of CuZn/GaN/CuZn. The content of Cu in the CuZn alloy should be 40 to 60 at %.

Then, the thickness of the GaN semiconductor layer showing conduction performance between ohmic conduction and semi-conductive conduction should be 1.2 to 1.6 nm. As that thickness exceeds 1.6 nm, it causes the semiconductor layer to have semiconductive conduction, giving rise to inconvenience: too large specific resistance. As that thickness is short of 1.2 nm, it causes the semiconductor layer to have ohmic conduction, failing to make improvements in specific resistance and, consequently, giving rise to inconvenience: any increase in the device area resistivity AR is not expectable.

(3-5) The first 41 and the second nonmagnetic metal layer 43 is each made of Zn so that the spacer layer 40 is made up of Zn/GaN/Zn.

Then, the thickness of the GaN semiconductor layer showing conduction performance between ohmic conduction and semi-conductive conduction should be 1.6 to 2.0 nm. As that thickness exceeds 2.0 nm, it causes the semiconductor layer to have semi-conductive conduction, giving rise to inconvenience: too large specific resistance. As that thickness is short of 1.6 nm, it causes the semiconductor layer to have ohmic conduction, failing to make improvements in specific resistance and, consequently, giving rise to inconvenience: any increase in the device area resistivity AR is not expectable.

The thickness of the aforesaid first 41, and the aforesaid second nonmagnetic metal layer 43 should be 0.15 to 0.85 nm, preferably 0.25 to 0.70 nm. As that value is below 0.15 nm, it does not permit a stable nonmagnetic metal layer to be formed, giving rise to inconvenience; the crystal growth of the ZnO or other semiconductor layer is out of order resulting in none of the MR ratio. At greater than 0.85 nm, on the other hand, spin-polarized electrons are scattered in the nonmagnetic metal layer, giving rise to inconvenience: no MR ratio is created.

The electroconductivity of the spacer layer 40 set up as described above is desirously in the range of 133 to 432 (S/cm), preferably 167 to 333 (S/cm). The electro-conductivity of the spacer layer 40 here is defined as the reciprocal of the resistivity ($\Omega \cdot cm$) of the spacer layer 40.

The spacer layer built up of the first nonmagnetic metal layer 41/semiconductor layer 42/second nonmagnetic metal layer 43 may be formed by film-formation techniques such as sputtering. After film formation, such a multilayer film is preferably heat treated at 200 to 350° C. for 1 to 10 hours. Usually, the heat treatment is carried out after the formation of the whole device.

(Explanation of the Antiferromagnetic Layer 22)

The antiferromagnetic layer 22 works such that by way of exchange coupling with the fixed magnetization layer 30 as described above, the magnetization direction of the fixed magnetization layer 30 is fixed.

For instance, the antiferromagnetic layer 22 is made of an antiferromagnetic material containing at least one element M' selected from the group of Pt, Ru, Rh, Pd, Ni, Cu, Ir, Cr and Fe, and Mn. The content of Mn is preferably 35 to 95 at %. The antiferromagnetic material is broken down into two types: (1) a non-heat treatment type antiferromagnetic material that shows anti-ferromagnetism even in the absence of heat treatment to induce an exchange coupling magnetic field between it and a ferromagnetic material, and (2) a heat treatment type antiferromagnetic material that comes to show anti-ferromagnetism by heat treatment. In the invention, both types (1) and (2) may be used. For instance, the non-heat treatment type antiferromagnetic material is exemplified by RuRhMn, FeMn, and IrMn, and the heat treatment type antiferromagnetic material is exemplified by PtMn, NiMn, and PtRhMn.

The antiferromagnetic layer 22 has a thickness of about 5 to 30 nm.

It is here noted that for the layer for fixing the magnetization direction of the fixed magnetization layer 30, it is acceptable to use a hard magnetic layer comprising a hard magnetic material such as CoPt in place of the aforesaid antiferromagnetic layer.

The underlay layer 21 formed below the anti-ferromagnetic layer 22 is provided to improve the crystallization and orientation of each of the layers stacked on it in general, and the exchange coupling of the antiferromagnetic layer 22 and the fixed magnetization layer 30 in particular. For such underlay layer 21, for instance, a multilayer structure of Ta and NiCr layers is used. The underlay layer 21 has a thickness of about 2 to 6 nm as an example.

In the invention, the area resistivity, AR, of the magneto-resistive effect device 5 (CPP-GMR device 5) is in the range of 0.1 to 0.3 $\Omega \cdot \mu m^2$, preferably 0.12 to 0.3 $\Omega \cdot \mu m^2$, and more preferably 0.14 to 0.28 $\Omega \cdot \mu m^2$. Any deviation from the range of 0.1 to 0.3 $\Omega \cdot \mu m^2$ would make it difficult to obtain large MR ratios while reducing noise and holding back the influences of spin torque.

The device (CPP-GMR device) to be measured for its area resistivity is a multilayer arrangement comprising the underlay layer 21, antiferromagnetic layer 22, fixed magnetization layer 30, spacer layer 40, free layer 50 and protective layer 26, as shown in FIG. 1.

Referring now to the insulating layer 4 shown in FIG. 1, it is made of an alumina material as an example. For the bias magnetic field-applying layer 6, for instance, use is made of a hard magnetic layer (hard magnet) or a multilayer arrangement of a ferromagnetic layer and an antiferromagnetic layer, specifically, CoPt, and CoCrPt.

The giant magneto-resistive effect device (CPP-GMR device) of the CPP structure in the embodiment of the invention as described above may be formed by means of vacuum film-formation techniques such as sputtering. If required, heat treatment may be applied after film-formation.

(Explanation of the Whole Construction of the Thin-Film Magnetic Head)

The whole construction of the thin-film magnetic head comprising the aforesaid magneto-resistive effect device is now explained. As already mentioned, FIGS. 2 and 3 are illustrative of the construction of the thin-film magnetic head according to one preferred embodiment of the invention; FIG. 2 is illustrative of a section of the thin-film magnetic head perpendicular to the ABS and a substrate and FIG. 3 is illustrative of a section of a magnetic pole portion of the thin-film magnetic head parallel with the ABS.

The whole structure of the thin-film magnetic head will be better understood when consideration is given to its fabrication process steps; the whole structure of the thin-film magnetic head is now explained with reference to its fabrication process steps.

First of all, an insulating layer 2 comprising an insulating material such as alumina ($Al_2O_3$) or silicon dioxide ($SiO_2$) is formed by sputtering or like techniques on a substrate 1 comprising a ceramic material such as AlTiC ($Al_2O_3 \cdot TiC$). That insulating layer has a thickness of about 0.5 to 20 μm as an example.

Then, a lower shield layer 3 comprising a magnetic material and adapted for a reproducing head is formed on that insulating layer 2. The shield layer 3 has a thickness of about 0.1 to 5 μm as an example. The magnetic material used for such lower shield layer 3, for instance, includes FeAlSi, NiFe, CoFe, CoFeNi, FeN, FeZrN, FeTaN, CoZrNb, and CoZrTa. The lower shield layer 3 is formed by sputtering, plating or like other techniques.

Then, a reproducing CPP-GMR device 5 is formed on the lower shield layer 3.

Although not shown, an insulating film is then formed in such a way as to cover two sides of the MR device and the upper surface of the first shield layer 3. The insulating film is formed of an insulating material such as alumina.

Then, two bias magnetic field-applying layers 6 are formed in such a way as to be adjacent to the two sides of the MR device 5 via the insulating layer. Then, an insulating film 7 is formed in such a way as to be located around the CPP-GMR device 5 and bias magnetic field-applying layers 6. The insulating film 7 is formed of an insulating material such as alumina.

Then, a second shield layer 8 for the reproducing head, comprising a magnetic material, is formed on the bias magnetic field-applying layers 6 and insulating layer 7. The second shield layer 8, for instance, is formed by means of plating or sputtering.

Then, a separation layer 18 comprising an insulating material such as alumina is formed by sputtering or the like on the upper shield layer 8. Then, a lower magnetic pole layer 19, comprising a magnetic material and adapted for a recording head, is formed by plating, sputtering or the like on the separation layer 18. The magnetic material used for the second shield layer 8, and the lower magnetic pole layer 19, for instance, includes a soft magnetic material such as NiFe, CoFe, CoFeNi, and FeN. It is here noted that instead of the multilayer arrangement of the second shield layer 8, separation layer 18 and lower magnetic pole layer 19, it is acceptable to configure the second shield layer in such a way as to work also as a lower electrode layer.

Then, a recording gap layer 9 comprising a non-magnetic material such as alumina is formed by sputtering or the like on the lower magnetic pole layer 19. That recording gap layer has a thickness of about 50 to 300 nm.

For the formation of a magnetic path, the recording gap layer 9 is then partially etched at the center of the thin-film coil to be described later to form a contact hole 9a.

Then, a first layer portion 10 of the thin-film coil, typically comprising copper (Cu), is formed on the recording gap layer 9 at a thickness of typically 2 to 3 μm. In FIG. 2, note that reference numeral 10a stands for a connector portion of the first layer portion 10, which is to be connected to a second layer portion 15 of the thin-film coil to be described later. The first layer portion 10 is wound around the contact hole 9a.

Then, an insulating layer 11 comprising a photo-resist or other organic material having fluidity upon heating is formed in such a given pattern as to cover the first layer portion 10 of the thin-film coil and the surrounding recording gap layer 9.

Then, the insulating layer 11 is heat treated at a given temperature to make its surface flat. By this heat treatment, each of the edge portions of the outer and inner peripheries of the insulating layer 11 is configured into a rounded slant.

Then, in an area of the insulating layer 11 from a slant portion on the medium opposite plane 20 (to be described later) side to the medium opposite plane 20 side, a track width-setting layer 12a of an upper magnetic pole layer 12 is formed on the recording gap layer 9 and insulating layer 11, using the magnetic material for the recording head. The upper magnetic pole layer 12 is made up of that track width-setting layer 12a, and a coupler portion layer 12b and a yoke portion layer 12c to be described later.

The track width-setting layer 12a is formed on the recording gap layer 9, including an end portion that provides a magnetic pole portion of the upper magnetic pole layer 12 and a connector portion that is formed on the slant portion of the insulating layer 11 on the medium opposite plane 20 side and connected to the yoke portion layer 12c. The width of that end portion is set equal to the recording track width, and the width of the connector portion is greater than the width of the end portion.

Simultaneously with the formation of the track width-setting layer 12a, the coupler portion 12b comprising a magnetic material is formed on the contact hole 9a and a connector layer 13 comprising a magnetic material is formed on the connector portion 10a. The coupler portion layer 12b forms a portion of the upper magnetic pole layer 12, which is to be magnetically connected to the upper shield layer 8.

Then, magnetic pole trimming is carried out. That is, in an area around the track width-setting layer 12a, the track width-setting layer 12a is used as a mask to etch at least a part of the recording gap layer 9 and the magnetic pole portion of the upper shield layer 8 on the recording gap layer 9 side, whereby, as shown in FIG. 3, there is a trim structure formed, in which at least a part of the magnetic pole portion of the upper magnetic pole layer 12, the recording gap layer 9 and the magnetic pole portion of the upper shield layer 8 has a uniform width. This trim structure makes sure prevention of an effective increase in the track width due to the spread of a magnetic flux near the recording gap layer 9.

Then, an insulating layer 14 comprising alumina or other inorganic insulating material is formed around the whole at a thickness of typically 3 to 4 μm.

Then, that insulating layer 14 is polished by chemo-mechanical polishing or the like as far as the surfaces of the track width-setting layer 12a, coupler portion layer 12b and connector layer 13 for flattening.

Then, the second layer portion 15 of the thin-film coil typically comprising copper (Cu) is formed on the flattened insulating layer 14 at a thickness of typically 2 to 3 μm. In FIG. 2, note that reference numeral 15a is indicative of a connector portion of the second layer portion 15, which is to be connected to the connector portion 10a of the first layer portion 10 of the thin-film coil by way of the connector layer 13. The second layer portion 15 is wound around the coupler portion layer 12b.

Then, an insulating layer 16 comprising a photo-resist or other organic material having fluidity upon heating is formed in such a given pattern as to cover the second layer portion 15 of the thin-film coil and the surrounding insulating layer 14.

Then, the insulating layer 16 is heat treated at a given temperature to make its surface flat. By this heat treatment, each of the edge portions of the outer and inner peripheries of the insulating layer 16 is configured into a rounded slant.

Then, the magnetic material for the recording head such as permalloy is used to form the yoke portion layer 12c forming the yoke portion of the upper magnetic layer 12 on the track width-setting layer 12a, insulating layers 14, 16 and coupler portion layer 12b. An end of the yoke layer portion 12c on the medium opposite plane 20 side is spaced away from the medium opposite plane 20, and the yoke portion layer 12c is connected to the lower magnetic pole layer 19 by way of the coupler portion layer 12b.

Then, an overcoat layer 17 typically comprising alumina is formed in such a way as to cover the whole. Finally, a slider including the aforesaid respective layers is machined to form the medium opposite plane 20 of the thin-film head including the recording head and reproducing head in the form of a complete thin-film magnetic head.

The thus fabricated thin-film magnetic head comprises the medium opposite plane 20 in opposition to the recording medium, the aforesaid reproducing head, and the recording head (induction type of magnetic device).

The magnetic head comprises the magnetic lower and upper magnetic pole layers 19 and 12 that include mutually opposite magnetic pole portions on the medium opposite plane 20 side and are magnetically coupled to each other, the recording gap layer 9 located between the magnetic pole portion of the lower magnetic pole layer 19 and the magnetic pole portion of the upper magnetic pole layer 12, and the thin films 10, 15 at least a part of which is located between the lower 19 and the upper magnetic pole layer 12 while insulated from them.

As shown in FIG. 2, such a thin-film magnetic head has a throat height (indicated by TH in the drawing) that is defined by a length from the medium opposite plane 20 up to the end of the insulating layer 11 on the medium opposite plane side. In other words, the "throat height" means a length (height) from the medium opposite plane 20 to a position at which the two magnetic pole layers start being spaced away.

(Explanation of how the Thin-Film Magnetic Head Works)

How the thin-film magnetic head according to the embodiment here works is now explained. The thin-film magnetic head records information in the recording medium by the recording head, and plays back the information recorded in the recording medium by the reproducing head.

At the reproducing head, the direction of a bias magnetic field applied by the bias magnetic field-applying layers 6 is orthogonal to the direction perpendicular to the medium opposite plane 20. At the CPP-GMR device 5 with no signal magnetic field applied yet, the magnetization direction of the free layer 50 lies in the direction of the bias magnetic field, and the magnetization direction of the fixed magnetization layer 30 is fixed in the direction perpendicular to the medium opposite plane 20.

At the CPP-GMR device 5, there is a change in the magnetization direction of the free layer 50 depending on a signal magnetic field from the recording medium, which in turn causes a change in the relative angle between the magnetization direction of the free layer 50 and the magnetization direction of the fixed magnetization layer 30, with the result that there is a change in the resistance value of the CPP-GMR device 5. The resistance value of the CPP-GMR device 5 may be found from a potential difference between the first and second shield layers, i.e., the two electrode layers 3 and 8 at the time when the sense current is passed through the MR device. It is thus possible for the reproducing head to play back the information recorded in the recording medium.

(Explanation of the Head Gimbal Assembly and the Hard Disk System)

The head gimbal assembly and the hard disk system according to the embodiment here are now explained.

A slider 210 included in the head gimbal assembly is first explained with reference to FIG. 4. In the hard disk system, the slider 210 is located in such a way as to face a hard disk that is a rotationally driven disk-form recording medium. This slider 210 primarily comprises a substrate 211 built up of a substrate 1 and an overcoat 24 depicted in FIG. 2.

The substrate 211 is in a generally hexahedral shape. Of the six surfaces of the substrate 211, one surface is in opposition to the hard disk. On that one surface there is a medium opposite plane 20 formed.

As the hard disk rotates in the z-direction in FIG. 4, it causes an air flow passing between the hard disk and the slider 210 to induce lift relative to the slider 210 in the downward y-direction in FIG. 4. This lift in turn causes the slider 210 to levitate over the surface of the hard disk. Note here that the x-direction in FIG. 4 traverses tracks on the hard disk.

Near the end of the slider 210 on an air exit side (the left lower end in FIG. 4), there is the thin-film magnetic head 100 formed according to the invention.

A head gimbal assembly 220 according to this embodiment is now explained with reference to FIG. 5. The head gimbal assembly 220 comprises a slider 210 and a suspension 221 adapted to resiliently support that slider 210. The suspension 221 comprises a leaf spring-form load beam 222 formed typically of stainless steel, a flexure 223 attached to one end of the load beam 222 and having the slider 210 joined to it for giving a suitable degree of flexibility to the slider 210, and a base plate 224 attached to the other end of the load beam 222.

The base plate 224 is adapted to be attached to an arm 230 of an actuator for moving the slider 210 in the track traverse direction x of the hard disk 262. The actuator comprises the arm 230 and a voice coil motor for driving that arm 230. At a portion of the flexure 223 having the slider 210 attached to it, there is a gimbal portion provided for keeping the posture of the slider 210 constant.

The head gimbal assembly 220 is attached to the arm 230 of the actuator. The head gimbal assembly 220 attached to one arm 230 is called a head arm assembly, whereas the head gimbal assembly 220 attached to a carriage at its plurality of arms is referred to as a head stack assembly.

FIG. 5 illustrates one example of the head arm assembly, wherein the head gimbal assembly 220 is attached to one end of the arm 230. To the other end of the arm 230, a coil 231 forming a part of the voice coil motor is attached. Halfway across the arm 230, there is a bearing portion 233 attached to a shaft 234 adapted to support the arm 230 in a pivotal fashion.

One example of the head stack assembly and the hard disk system according to the instant embodiment are now explained with reference to FIGS. 6 and 7.

FIG. 6 is illustrative of part of the magnetic disk system, and FIG. 7 is a plan view of the hard disk system.

A head stack assembly 250 comprises a carriage 251 having a plurality of arms 252. The plurality of arms 252 are provided with a plurality of the head gimbal assemblies 220 such that they line up vertically at an interval. On the side of the carriage 251 that faces away from the arms 252, there is a coil 253 attached, which coil becomes a part of the voice coil motor. The head stack assembly 250 is incorporated in the hard disk system.

The hard disk system comprises a plurality of hard disks 262 attached to a spindle motor 261. For each hard disk 262, two sliders 210 are located such that they are opposite to each other with the hard disk 262 held between them. The voice coil motor has also permanent magnets 263 located at opposite positions with the coil 253 of the head stack assembly 250 held between them.

The head stack assembly 250 except the slider 210 and the actuator correspond to the positioning device here which is operable to support the slider 210 and position it relative to the hard disk 262.

With the hard disk system here, the actuator is actuated to move the slider 210 in the track traverse direction of the hard disk 262, thereby positioning the slider 210 with respect to the hard disk 262. The thin-film magnetic head incorporated in the slider 210 works such that information is recorded by a recording head in the hard disk 262, and the information recorded in the hard disk 262 is played back by a reproducing head.

The head gimbal assembly and the magnetic disk system here have pretty much the same action as the thin-film magnetic head according to the foregoing embodiment.

While the embodiment here has been described with reference to the thin-film magnetic head of the structure wherein the reproducing head is located on the substrate side and the recording head is stacked on the reproducing head, it is contemplated that that order of stacking could be reversed. When the thin-film magnetic head here is used as a read-only head, the recording head could be removed from it.

It is also contemplated that part of the invention may be applied not only to magnetic heads but also as a so-called thin-film magnetic field sensor adapted to detect a magnetic field.

EXAMPLES

The invention of the CPP-GMR device as described above is now explained in further details with reference to many specific examples.

Experimental Example I

First of all, there was experimentation carried out to find the thickness of a semiconductor layer having a transitional area showing conduction performance halfway between ohmic conduction and semi-conductive conduction.

That is to say, a (first nonmagnetic metal layer/semiconductor layer/second nonmagnetic metal layer) forming the spacer layer was first stacked on the free layer forming a part of an ordinary GMR device. Then, while the thickness of the semiconductor layer was varied, fluctuations in the electrical resistance across the spacer plane were observed to make a judgment of whether the (first nonmagnetic metal layer/semiconductor layer/second nonmagnetic metal layer) was an ohmic area, a semi-conductive area or a transitional area having performance halfway between them in what semiconductor layer thickness.

The specific multilayer structure used here was Ru (thickness: 5 nm)/CoFe (thickness: 3 nm)/(first nonmagnetic metal layer/semiconductor layer/second nonmagnetic metal layer)/Ru (thickness: 2 nm). As set out in Tables 1 to 14, combinations of the materials forming the spacer layer (first nonmagnetic metal layer/semiconductor layer/second nonmagnetic metal layer) were:
Tables 1, 2, 3 and 4:
(Zn/ZnO/Zn), (Ti/ZnO/Ti), (V/ZnO/V), (Cr/ZnO/Cr);
Tables 5, 6, 7, 8 and 9:
(Cu/ZnS/Cu), (Ag/ZnS/Ag), (Au/ZnS/Au), (CuZn/ZnS/CuZn), (Zn/ZnS/Zn); and
Tables 10, 11, 12, 13 and 14;
(Cu/GaN/Cu), (Ag/GaN/Ag), (Au/GaN/Au), (CuZn/GaN/CuZn), (Zn/GaN/Zn).

The first, and the second nonmagnetic metal layer had a thickness of 0.7 nm.

While the thickness of the semiconductor layer was varied as set out in Tables 1 to 14, on the other hand, it was found whether the (first nonmagnetic metal layer /semiconductor layer/second nonmagnetic metal layer) was an ohmic area, a semi-conductive area or a transitional area having performance halfway between them in what semiconductor layer thickness. One specific approach to this is given below.

Figure 8:
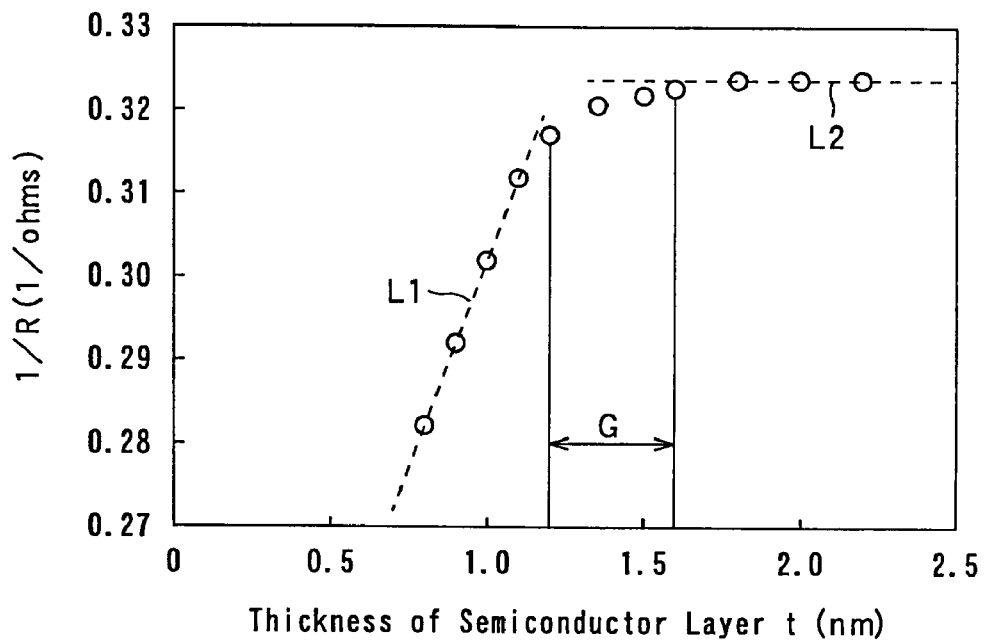
FIG. 8 is a graph obtained by the plotting of the respective data points with the thickness t (nm) of the semiconductor layer as abscissa and 1/R (1/Ω) that is the reciprocal of sheet resistance (Ω) as ordinate; it is a graph illustrative of how to find a transitional area used here showing conduction performance between ohomic conduction and semi conductive conduction.

That is, data points are plotted with the thickness t (nm) of the semiconductor layer as abscissa and $1/R$ ($1/\Omega$) that is the reciprocal of sheet resistance R ($\Omega$) as ordinate, as shown in the graph of FIG. 8 indicative of one example of experimental data (exclusively based on the data for illustration alone). With the specific resistivity ρ factored in, the following equation (1) holds:

$$1/R = (1/\rho)t \quad (1)$$

Therefore, in the graph of FIG. 8 indicative of the relation of 1/R vs. t, an area having a constant gradient (1/ρ) (the area indicated by a dotted line L1 in FIG. 8) is an ohmic conductive area, and an area having a gradient (1/ρ) of 0 (the area indicated by a dotted line L2 in FIG. 8) is a semi-conductive area with an infinite specific resistivity ρ.

The intermediate area between them (the double-arrowed area G) is the transitional area used herein that shows conduction performance halfway between ohmic conduction and semi-conductive conduction.

The measurements obtained in this way are set out in Tables 1 to 14, and graphs prepared on the basis of them are shown in FIGS. 9 to 22.

TABLE 1

(Zn/ZnO/Zn)

| Sample No. | Spacer (Zn/ZnO/Zn) Semiconductor Layer ZnO Thickness (nm) | 1/R (1/Ω) |
|---|---|---|
| ZZ-1 | 0.6 | 0.205 |
| ZZ-2 | 0.7 | 0.233 |
| ZZ-3 | 0.8 | 0.263 |
| ZZ-4 | 0.9 | 0.297 |
| ZZ-5 | 1.0 | 0.304 |
| ZZ-6 | 1.1 | 0.311 |
| ZZ-7 | 1.2 | 0.315 |
| ZZ-8 | 1.3 | 0.320 |
| ZZ-9 | 1.4 | 0.323 |
| ZZ-10 | 1.5 | 0.325 |
| ZZ-11 | 1.6 | 0.327 |
| ZZ-12 | 1.7 | 0.329 |
| ZZ-13 | 1.8 | 0.329 |
| ZZ-14 | 1.9 | 0.329 |
| ZZ-15 | 2.0 | 0.329 |
| ZZ-16 | 2.1 | 0.329 |
| ZZ-17 | 2.2 | 0.329 |

Figure 9:
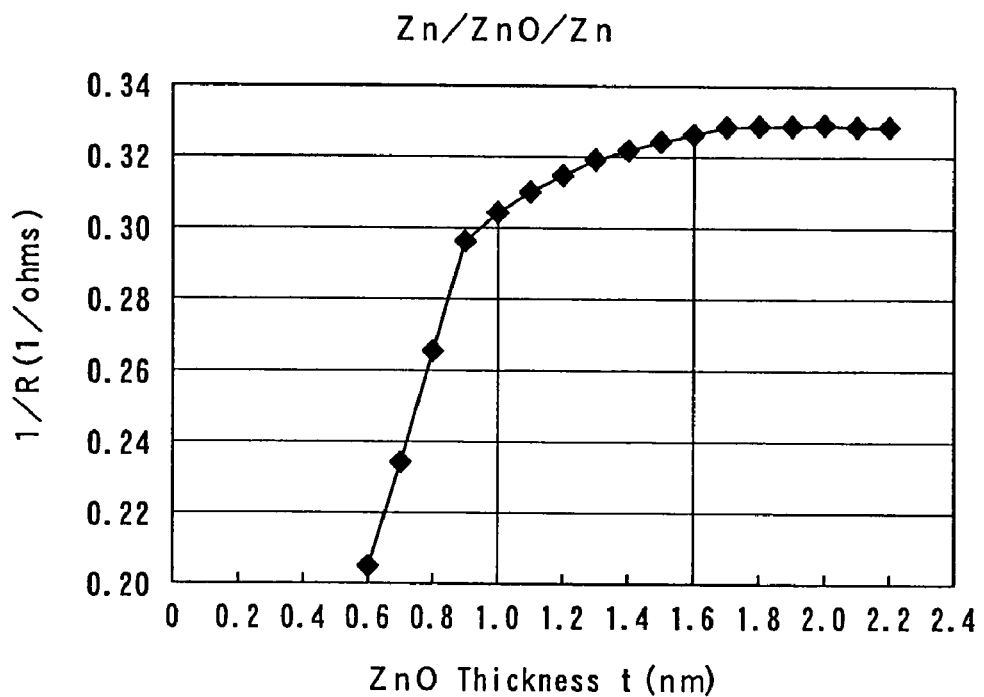
FIG. 9 is a graph for finding a transitional area used here showing conduction performance between ohomic conduction and semi-conductive conduction.

From the results of Table 1 and FIG. 9, it is found that when the semiconductor layer is ZnO and the first and second nonmagnetic metal layers are each Zn, the range of the ZnO semiconductor layer having a thickness of 1.0 to 1.6 nm provides a transitional area showing conduction performance halfway between ohmic conduction and semi-conductive conduction.

TABLE 2

(Ti/ZnO/Ti)

| Sample No. | Spacer (Ti/ZnO/Ti) Semiconductor Layer ZnO Thickness (nm) | 1/R (1/Ω) |
|---|---|---|
| TZ-1 | 0.4 | 0.205 |
| TZ-2 | 0.5 | 0.230 |
| TZ-3 | 0.6 | 0.254 |
| TZ-4 | 0.7 | 0.276 |
| TZ-5 | 0.8 | 0.282 |
| TZ-6 | 0.9 | 0.287 |
| TZ-7 | 1.0 | 0.289 |
| TZ-8 | 1.1 | 0.292 |
| TZ-9 | 1.2 | 0.294 |
| TZ-10 | 1.3 | 0.296 |
| TZ-11 | 1.4 | 0.296 |
| TZ-12 | 1.5 | 0.296 |
| TZ-13 | 1.6 | 0.296 |
| TZ-14 | 1.7 | 0.296 |

Figure 10:
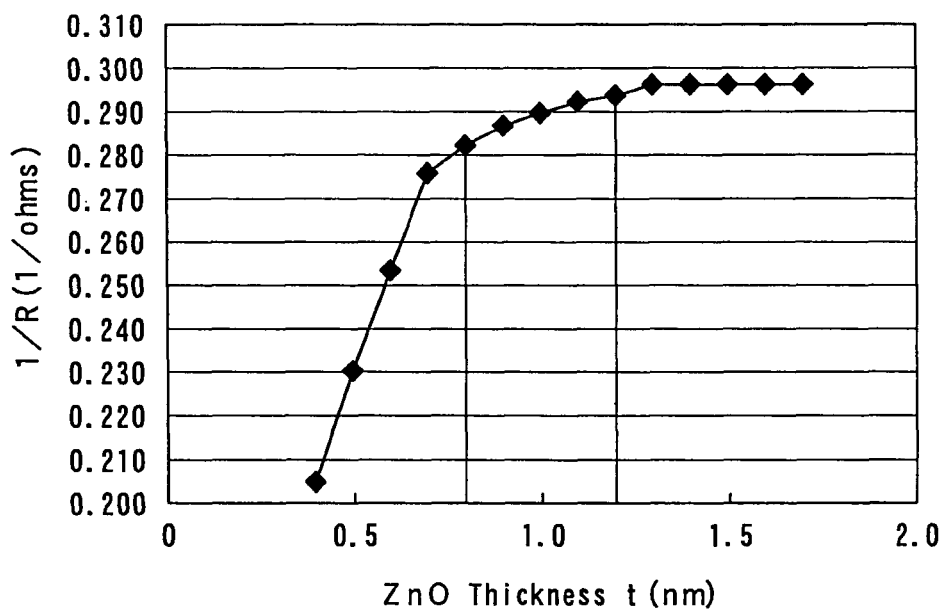
FIG. 10 is a graph for finding another transitional area used here showing conduction performance between ohomic conduction and semi-conductive conduction.

From the results of Table 2 and FIG. 10, it is found that when the semiconductor layer is ZnO and the first and second nonmagnetic metal layers are each Ti, the range of the ZnO semiconductor layer having a thickness of 0.8 to 1.2 nm provides a transitional area showing conduction performance halfway between ohmic conduction and semi-conductive conduction.

TABLE 3

(V/ZnO/V)

| Sample No. | Spacer (V/ZnO/V) Semiconductor Layer ZnO Thickness (nm) | 1/R (1/Ω) |
|---|---|---|
| VZ-1 | 0.6 | 0.230 |
| VZ-2 | 0.7 | 0.245 |
| VZ-3 | 0.8 | 0.262 |
| VZ-4 | 0.9 | 0.276 |
| VZ-5 | 1.0 | 0.293 |
| VZ-6 | 1.1 | 0.312 |
| VZ-7 | 1.2 | 0.322 |
| VZ-8 | 1.3 | 0.328 |
| VZ-9 | 1.4 | 0.332 |
| VZ-10 | 1.5 | 0.335 |
| VZ-11 | 1.6 | 0.338 |
| VZ-12 | 1.7 | 0.340 |
| VZ-13 | 1.8 | 0.340 |
| VZ-14 | 1.9 | 0.340 |
| VZ-15 | 2.0 | 0.340 |
| VZ-16 | 2.1 | 0.340 |
| VZ-17 | 2.2 | 0.340 |

Figure 11:
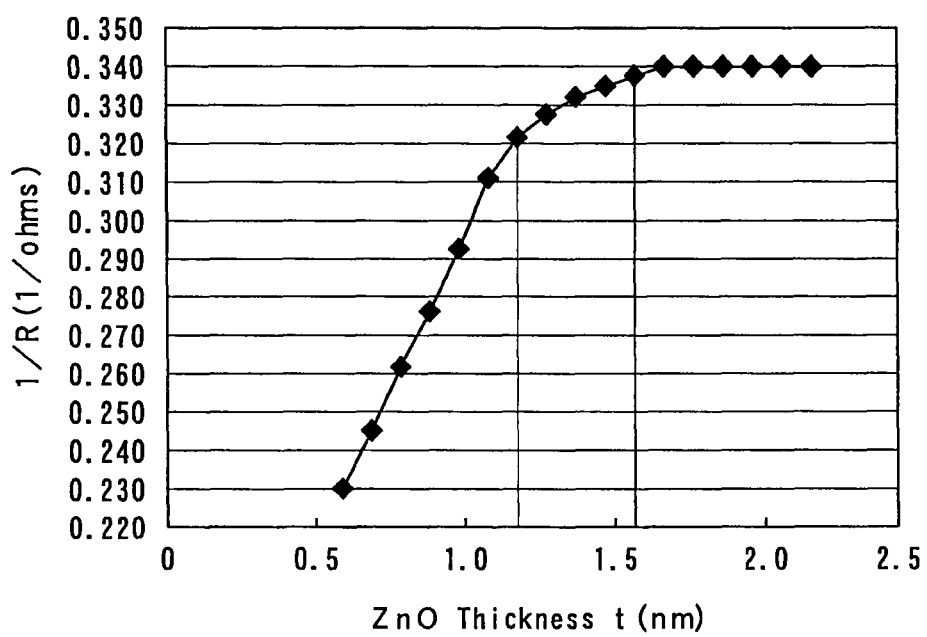
FIG. 11 is a graph for finding yet another transitional area used here showing conduction performance between ohomic conduction and semi-conductive conduction.

From the results of Table 3 and FIG. 11, it is found that when the semiconductor layer is ZnO and the first and second nonmagnetic metal layers are each V, the range of the ZnO semiconductor layer having a thickness of 1.2 to 1.6 nm provides a transitional area showing conduction performance halfway between ohmic conduction and semi-conductive conduction.

TABLE 4

(Cr/ZnO/Cr)

| Sample No. | Spacer (Cr/ZnO/Cr) Semiconductor Layer ZnO Thickness (nm) | 1/R (1/Ω) |
|---|---|---|
| CZ-1 | 1.2 | 0.171 |
| CZ-2 | 1.3 | 0.196 |

TABLE 4-continued (Cr/ZnO/Cr)

| Sample No. | Spacer (Cr/ZnO/Cr) Semiconductor Layer ZnO Thickness (nm) | 1/R (1/Ω) |
|---|---|---|
| CZ-3 | 1.4 | 0.219 |
| CZ-4 | 1.5 | 0.243 |
| CZ-5 | 1.6 | 0.248 |
| CZ-6 | 1.7 | 0.253 |
| CZ-7 | 1.8 | 0.255 |
| CZ-8 | 1.9 | 0.257 |
| CZ-9 | 2.0 | 0.258 |
| CZ-10 | 2.1 | 0.260 |
| CZ-11 | 2.2 | 0.260 |
| CZ-12 | 2.3 | 0.260 |
| CZ-13 | 2.4 | 0.260 |

Figure 12:
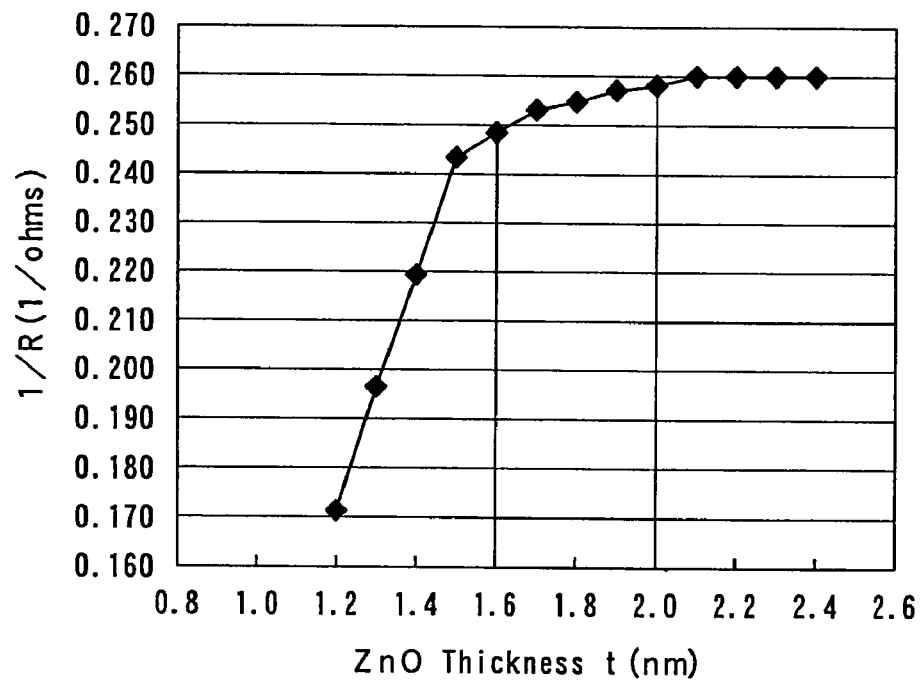
FIG. 12 is a graph for finding a further transitional area used here showing conduction performance between ohomic conduction and semi-conductive conduction.

From the results of Table 4 and FIG. 12, it is found that when the semiconductor layer is ZnO and the first and second nonmagnetic metal layers are each Cr, the range of the ZnO semiconductor layer having a thickness of 1.6 to 2.0 nm provides a transitional area showing conduction performance halfway between ohmic conduction and semi-conductive conduction.

TABLE 5

(Cu/ZnS/Cu)

| Sample No. | Spacer (Cu/ZnS/Cu) Semiconductor Layer ZnS Thickness (nm) | 1/R (1/Ω) |
|---|---|---|
| CS-1 | 0.8 | 0.226 |
| CS-2 | 0.9 | 0.257 |
| CS-3 | 1.0 | 0.295 |
| CS-4 | 1.1 | 0.326 |
| CS-5 | 1.2 | 0.338 |
| CS-6 | 1.3 | 0.347 |
| CS-7 | 1.4 | 0.355 |
| CS-8 | 1.5 | 0.357 |
| CS-9 | 1.6 | 0.362 |
| CS-10 | 1.7 | 0.365 |
| CS-11 | 1.8 | 0.365 |
| CS-12 | 1.9 | 0.365 |
| CS-13 | 2.0 | 0.365 |
| CS-14 | 2.1 | 0.365 |

Figure 13:
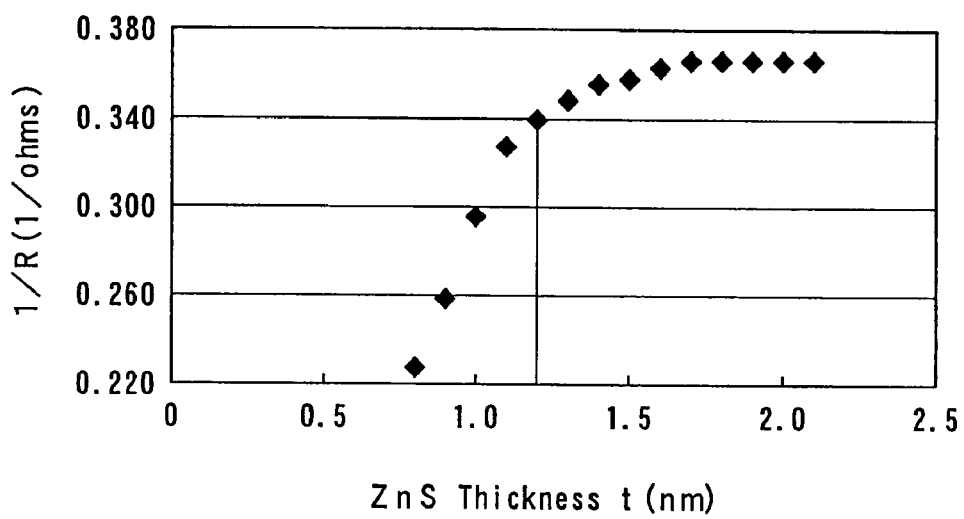
FIG. 13 is a graph for finding a further transitional area used here showing conduction performance between ohomic conduction and semi-conductive conduction.

From the results of Table 5 and FIG. 13, it is found that when the semiconductor layer is ZnS and the first and second nonmagnetic metal layers are each Cu, the range of the ZnS semiconductor layer having a thickness of 1.2 to 1.6 nm provides a transitional area showing conduction performance halfway between ohmic conduction and semi-conductive conduction.

TABLE 6

(Ag/ZnS/Ag)

| Sample No. | Spacer (Ag/ZnS/Ag) Semiconductor Layer ZnS Thickness (nm) | 1/R (1/Ω) |
|---|---|---|
| AS-1 | 0.6 | 0.303 |
| AS-2 | 0.7 | 0.396 |
| AS-3 | 0.8 | 0.486 |
| AS-4 | 0.9 | 0.568 |
| AS-5 | 1.0 | 0.594 |
| AS-6 | 1.1 | 0.609 |
| AS-7 | 1.2 | 0.630 |
| AS-8 | 1.3 | 0.644 |
| AS-9 | 1.4 | 0.652 |
| AS-10 | 1.5 | 0.660 |
| AS-11 | 1.6 | 0.663 |
| AS-12 | 1.7 | 0.660 |
| AS-13 | 1.8 | 0.660 |

Figure 14:
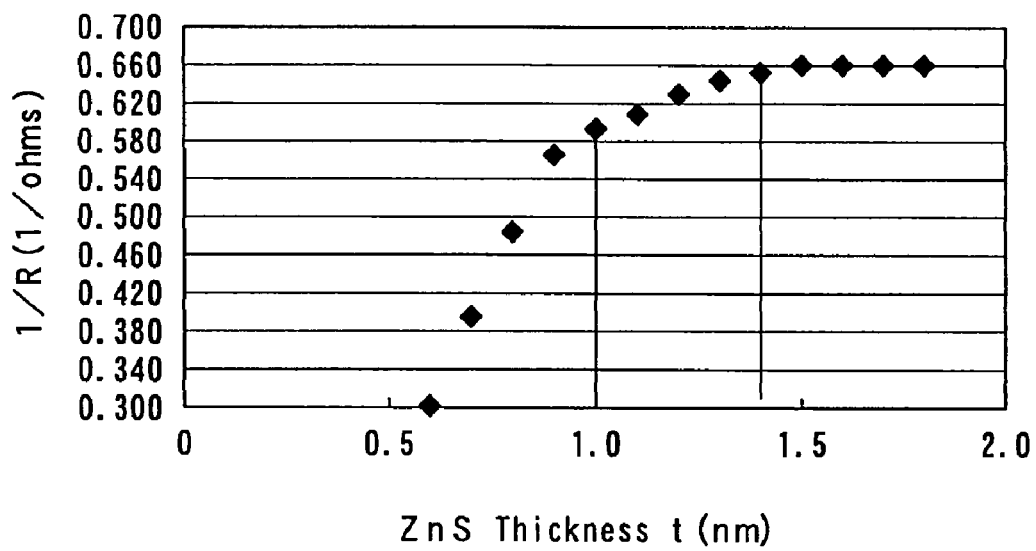
FIG. 14 is a graph for finding a further transitional area used here showing conduction performance between ohomic conduction and semi-conductive conduction.

From the results of Table 6 and FIG. 14, it is found that when the semiconductor layer is ZnS and the first and second nonmagnetic metal layers are each Ag, the range of the ZnS semiconductor layer having a thickness of 1.0 to 1.4 nm provides a transitional area showing conduction performance halfway between ohmic conduction and semi-conductive conduction.

TABLE 7

(Au/ZnS/Au)

| Sample No. | Spacer (Au/ZnS/Au) Semiconductor Layer ZnS Thickness (nm) | 1/R (1/Ω) |
|---|---|---|
| US-1 | 0.8 | 0.237 |
| US-2 | 0.9 | 0.264 |
| US-3 | 1.0 | 0.289 |
| US-4 | 1.1 | 0.315 |
| US-5 | 1.2 | 0.324 |
| US-6 | 1.3 | 0.328 |
| US-7 | 1.4 | 0.331 |
| US-8 | 1.5 | 0.335 |
| US-9 | 1.6 | 0.336 |
| US-10 | 1.7 | 0.340 |
| US-11 | 1.8 | 0.340 |
| US-12 | 1.9 | 0.340 |
| US-13 | 2.0 | 0.340 |

Figure 15:
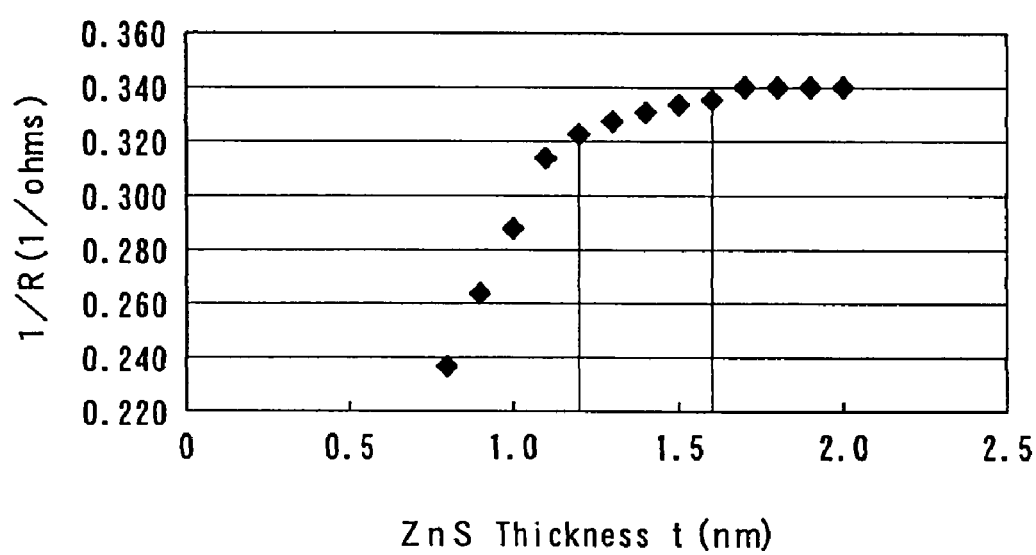
FIG. 15 is a graph for finding a further transitional area used here showing conduction performance between ohomic conduction and semi-conductive conduction.

From the results of Table 7 and FIG. 15, it is found that when the semiconductor layer is ZnS and the first and second nonmagnetic metal layers are each Au, the range of the ZnS semiconductor layer having a thickness of 1.2 to 1.6 nm provides a transitional area showing conduction performance halfway between ohmic conduction and semi-conductive conduction.

TABLE 8

(CuZn/ZnS/CuZn)

| Sample No. | Spacer (CuZn/ZnS/CuZn) Semiconductor Layer ZnS Thickness (nm) | 1/R (1/Ω) |
|---|---|---|
| CZS-1 | 0.8 | 0.444 |
| CZS-2 | 0.9 | 0.488 |
| CZS-3 | 1.0 | 0.534 |
| CZS-4 | 1.1 | 0.572 |
| CZS-5 | 1.2 | 0.580 |
| CZS-6 | 1.3 | 0.586 |
| CZS-7 | 1.4 | 0.590 |
| CZS-8 | 1.5 | 0.594 |
| CZS-9 | 1.6 | 0.597 |
| CZS-10 | 1.7 | 0.601 |
| CZS-11 | 1.8 | 0.601 |
| CZS-12 | 1.9 | 0.601 |
| CZS-13 | 2.0 | 0.601 |

Figure 16:
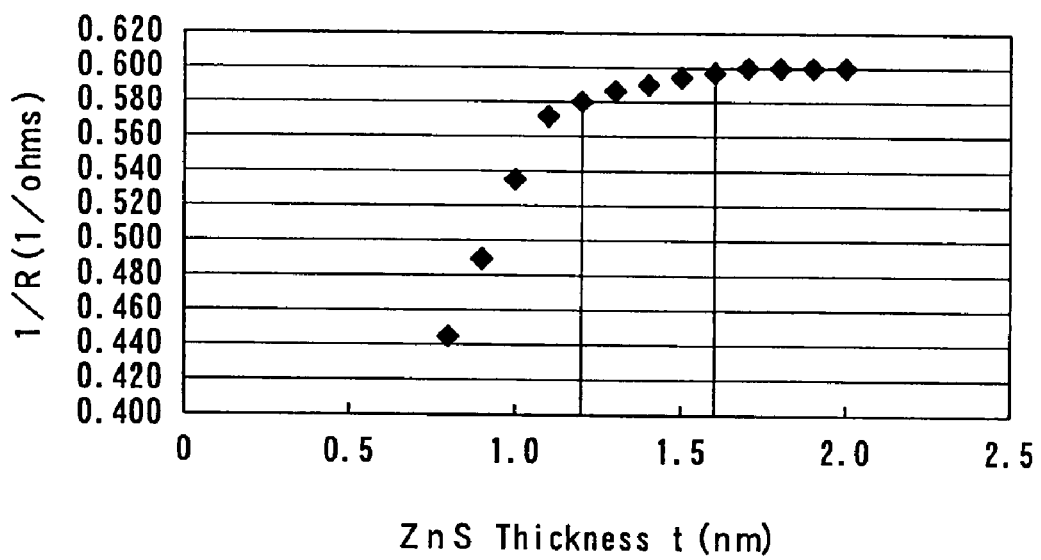
FIG. 16 is a graph for finding a further transitional area used here showing conduction performance between ohomic conduction and semi-conductive conduction.

From the results of Table 8 and FIG. 16, it is found that when the semiconductor layer is ZnS and the first and second nonmagnetic metal layers are each CuZn, the range of the ZnS semiconductor layer having a thickness of 1.2 to 1.6 nm provides a transitional area showing conduction performance halfway between ohmic conduction and semi-conductive conduction.

TABLE 9

(Zn/ZnS/Zn)

| Sample No. | Spacer (Zn/ZnS/Zn) Semiconductor Layer ZnS Thickness (nm) | 1/R (1/Ω) |
|---|---|---|
| ZS-1 | 1.2 | 0.287 |
| ZS-2 | 1.3 | 0.299 |
| ZS-3 | 1.4 | 0.310 |
| ZS-4 | 1.5 | 0.320 |
| ZS-5 | 1.6 | 0.326 |
| ZS-6 | 1.7 | 0.328 |
| ZS-7 | 1.8 | 0.331 |
| ZS-8 | 1.9 | 0.333 |
| ZS-9 | 2.0 | 0.335 |
| ZS-10 | 2.1 | 0.336 |
| ZS-11 | 2.2 | 0.336 |
| ZS-12 | 2.3 | 0.336 |
| ZS-13 | 2.4 | 0.336 |

Figure 17:
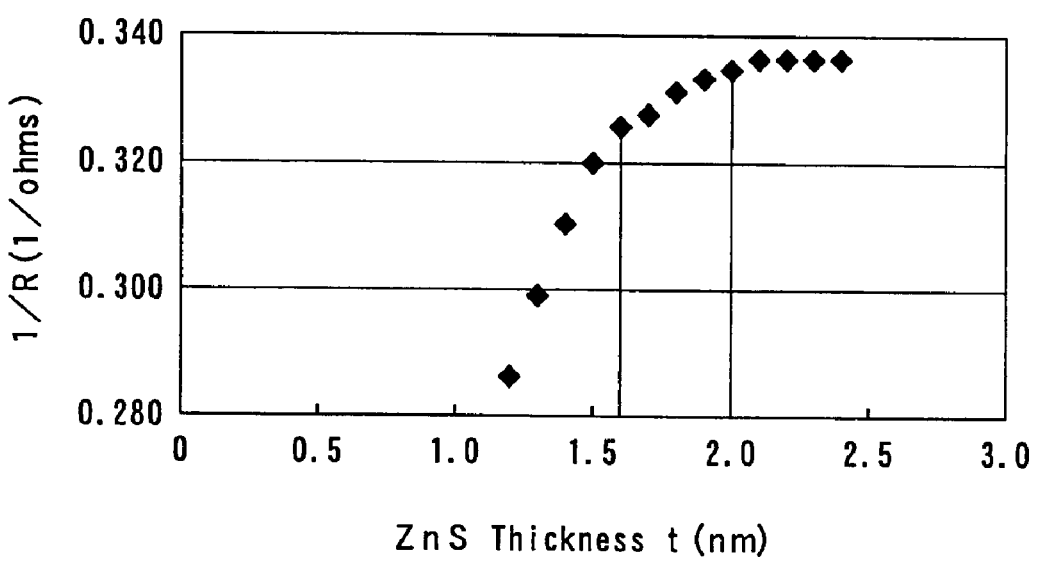
FIG. 17 is a graph for finding a further transitional area used here showing conduction performance between ohomic conduction and semi-conductive conduction.

From the results of Table 9 and FIG. 17, it is found that when the semiconductor layer is ZnS and the first and second nonmagnetic metal layers are each Zn, the range of the ZnS semiconductor layer having a thickness of 1.6 to 2.0 nm provides a transitional area showing conduction performance halfway between ohmic conduction and semi-conductive conduction.

TABLE 10

(Cu/GaN/Cu)

| Sample No. | Spacer (Cu/GaN/Cu) Semiconductor Layer GaN Thickness (nm) | 1/R (1/Ω) |
|---|---|---|
| CG-1 | 0.8 | 0.464 |
| CG-2 | 0.9 | 0.499 |
| CG-3 | 1.0 | 0.530 |
| CG-4 | 1.1 | 0.562 |
| CG-5 | 1.2 | 0.572 |
| CG-6 | 1.3 | 0.577 |
| CG-7 | 1.4 | 0.582 |
| CG-8 | 1.5 | 0.584 |
| CG-9 | 1.6 | 0.587 |
| CG-10 | 1.7 | 0.591 |
| CG-11 | 1.8 | 0.591 |
| CG-12 | 1.9 | 0.591 |
| CG-13 | 2.0 | 0.591 |

Figure 18:
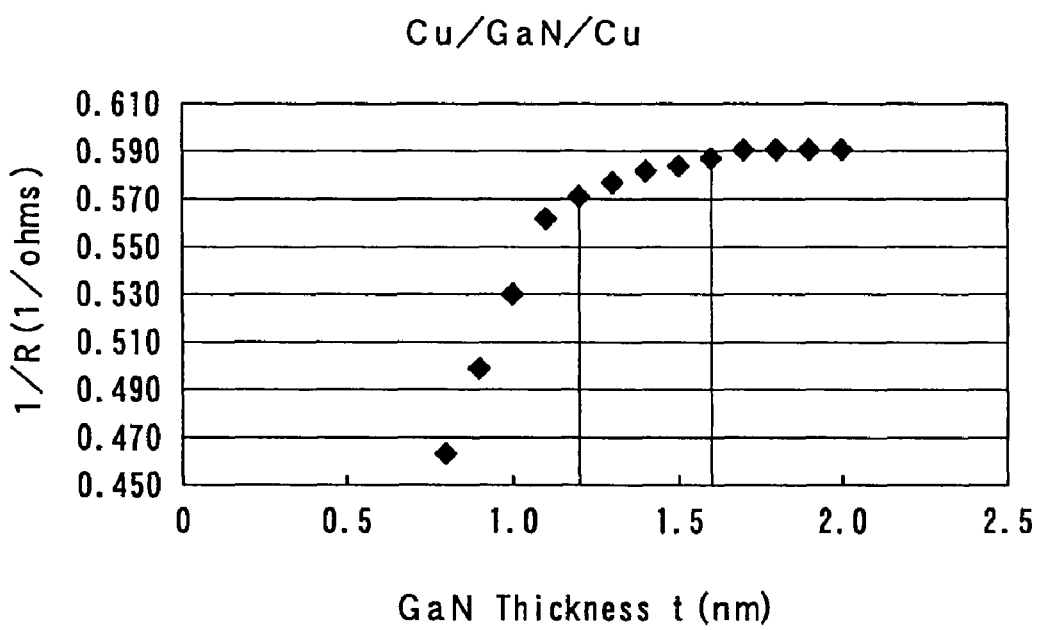
FIG. 18 is a graph for finding a further transitional area used here showing conduction performance between ohomic conduction and semi-conductive conduction.

From the results of Table 10 and FIG. 18, it is found that when the semiconductor layer is GaN and the first and second nonmagnetic metal layers are each Cu, the range of the GaN semiconductor layer having a thickness of 1.2 to 1.6 nm provides a transitional area showing conduction performance halfway between ohmic conduction and semi-conductive conduction.

TABLE 11

(Ag/GaN/Ag)

| Sample No. | Spacer (Ag/GaN/Ag) Semiconductor Layer GaN Thickness (nm) | 1/R (1/Ω) |
|---|---|---|
| AG-1 | 0.6 | 0.398 |
| AG-2 | 0.7 | 0.459 |
| AG-3 | 0.8 | 0.513 |
| AG-4 | 0.9 | 0.571 |
| AG-5 | 1.0 | 0.592 |
| AG-6 | 1.1 | 0.600 |
| AG-7 | 1.2 | 0.606 |
| AG-8 | 1.3 | 0.612 |
| AG-9 | 1.4 | 0.616 |
| AG-10 | 1.5 | 0.621 |
| AG-11 | 1.6 | 0.621 |
| AG-12 | 1.7 | 0.621 |
| AG-13 | 1.8 | 0.621 |

Figure 19:
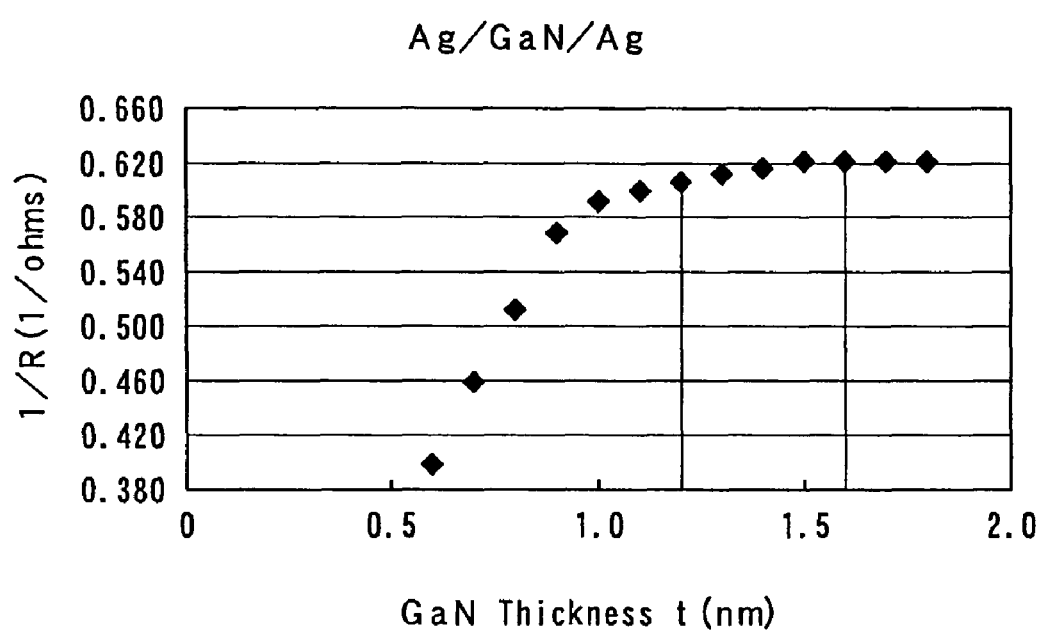
FIG. 19 is a graph for finding a further transitional area used here showing conduction performance between ohomic conduction and semi-conductive conduction.

From the results of Table 11 and FIG. 19, it is found that when the semiconductor layer is GaN and the first and second nonmagnetic metal layers are each Ag, the range of the GaN semiconductor layer having a thickness of 1.0 to 1.4 nm provides a transitional area showing conduction performance halfway between ohmic conduction and semi-conductive conduction.

TABLE 12

(Au/GaN/Au)

| Sample No. | Spacer (Au/GaN/Au) Semiconductor Layer GaN Thickness (nm) | 1/R (1/Ω) |
|---|---|---|
| UG-1 | 0.4 | 0.372 |
| UG-2 | 0.5 | 0.432 |
| UG-3 | 0.6 | 0.488 |
| UG-4 | 0.7 | 0.543 |
| UG-5 | 0.8 | 0.564 |
| UG-6 | 0.9 | 0.578 |
| UG-7 | 1.0 | 0.585 |
| UG-8 | 1.1 | 0.591 |
| UG-9 | 1.2 | 0.592 |
| UG-10 | 1.3 | 0.598 |
| UG-11 | 1.4 | 0.598 |
| UG-12 | 1.5 | 0.598 |
| UG-13 | 1.6 | 0.598 |

Figure 20:
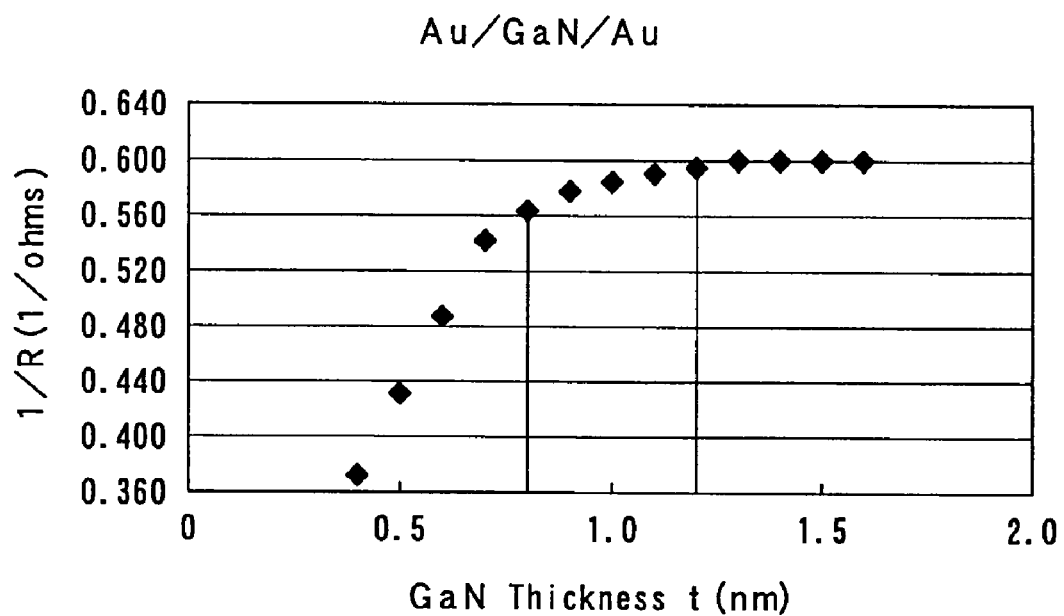
FIG. 20 is a graph for finding a further transitional area used here showing conduction performance between ohomic conduction and semi-conductive conduction.

From the results of Table 12 and FIG. 20, it is found that when the semiconductor layer is GaN and the first and second nonmagnetic metal layers are each Au, the range of the GaN semiconductor layer having a thickness of 0.8 to 1.2 nm provides a transitional area showing conduction performance halfway between ohmic conduction and semi-conductive conduction.

TABLE 13

(CuZn/GaN/CuZn)

| Sample No. | Spacer (CuZn/GaN/CuZn) Semiconductor Layer GaN Thickness (nm) | 1/R (1/Ω) |
|---|---|---|
| CZG-1 | 0.8 | 0.412 |
| CZG-2 | 0.9 | 0.442 |
| CZG-3 | 1.0 | 0.470 |
| CZG-4 | 1.1 | 0.495 |
| CZG-5 | 1.2 | 0.501 |
| CZG-6 | 1.3 | 0.507 |
| CZG-7 | 1.4 | 0.512 |
| CZG-8 | 1.5 | 0.516 |
| CZG-9 | 1.6 | 0.518 |
| CZG-10 | 1.7 | 0.521 |
| CZG-11 | 1.8 | 0.521 |
| CZG-12 | 1.9 | 0.521 |
| CZG-13 | 2.0 | 0.521 |

Figure 21:
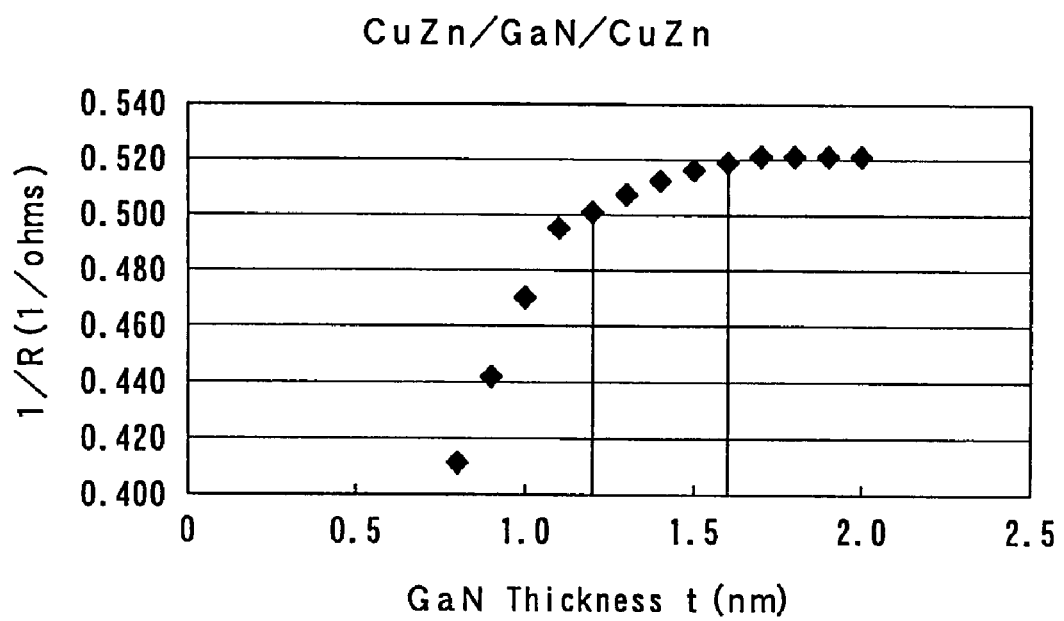
FIG. 21 is a graph for finding a further transitional area used here showing conduction performance between ohomic conduction and semi-conductive conduction.

From the results of Table 13 and FIG. 21, it is found that when the semiconductor layer is GaN and the first and second nonmagnetic metal layers are each CuZn, the range of the GaN semiconductor layer having a thickness of 1.2 to 1.6 nm provides a transitional area showing conduction performance halfway between ohmic conduction and semi-conductive conduction.

TABLE 14

(Zn/GaN/Zn)

| Sample No. | Spacer (Zn/GaN/Zn) Semiconductor Layer GaN Thickness (nm) | 1/R (1/Ω) |
|---|---|---|
| ZG-1 | 1.2 | 0.224 |
| ZG-2 | 1.3 | 0.244 |
| ZG-3 | 1.4 | 0.265 |
| ZG-4 | 1.5 | 0.281 |
| ZG-5 | 1.6 | 0.288 |
| ZG-6 | 1.7 | 0.290 |
| ZG-7 | 1.8 | 0.293 |
| ZG-8 | 1.9 | 0.294 |
| ZG-9 | 2.0 | 0.295 |
| ZG-10 | 2.1 | 0.297 |
| ZG-11 | 2.2 | 0.297 |
| ZG-12 | 2.3 | 0.297 |
| ZG-13 | 2.4 | 0.297 |

Figure 22:
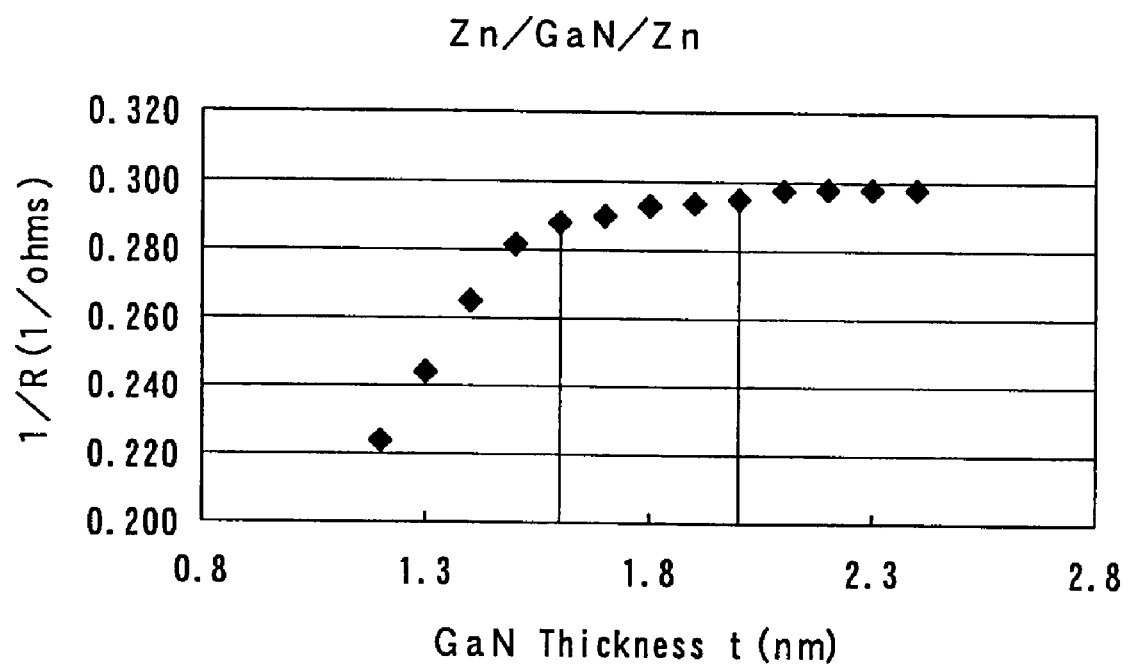
FIG. 22 is a graph for finding a further transitional area used here showing conduction performance between ohomic conduction and semi-conductive conduction.

From the results of Table 14 and FIG. 22, it is found that when the semiconductor layer is GaN and the first and second nonmagnetic metal layers are each Zn, the range of the GaN semiconductor layer having a thickness of 1.6 to 2.0 nm provides a transitional area showing conduction performance halfway between ohmic conduction and semi-conductive conduction.

Experimental Example II

Such a CPP-GMR device sample as set out in Table 15 was formed by sputtering and readied up for experimentation.

TABLE 15

| Multilayer Structure | | Layer Material | Thickness (nm) |
|---|---|---|---|
| Protective Layer | | Ru | 2.0 |
| Free Layer | | Co70Fe30 | 4.0 |
| Spacer Layer | 2$^{nd}$ Nonmagnetic Metal Layer | Zn, Ti, V, Cr, Cu, Ag, Au, Or CuZn | T22 |
| | Semiconductor Layer | ZnO, ZnS, or GaN | t |
| | 1$^{st}$ Nonmagnetic Metal Layer | Zn, Ti, V, Cr, Cu, Ag, Au, Or CuZn | T11 |
| Fixed Magnetization Layer | Inner Layer | Co70Fe30 | 3.5 |
| | Nonmagnetic Intermediate Layer | Ru | 0.8 |
| | Outer Layer | Co70Fe30 | 3.0 |
| Antiferromagnetic Layer | | IrMn | 5.0 |
| Underlay Layer | | (Ta/Ru) | (1.0/2.0) |

Note here that in the actual preparation of specific device samples, the type and thickness of the semiconductor forming a part of the spacer layer and the type and thickness of the first, and the second non-magnetic metal layer in Table 15 were varied as described below to measure each CPP-GMR device sample for (1) the MR ratio (%). Although the main purpose of that measurement was to find the MR ratio, yet at the same time (2) the area resistivity AR (Ω·μm$^2$) and (3) the electroconductivity (S/cm) of the spacer layer were measured as described below. These measurements are also tabulated.

It is also noted that the samples were prepared by configuring the respective layers forming the CPP-GMR device in order into a multilayer structure, and then heat treating it at 270° C. for 3 hours.

(1) MR Ratio (%) The MR ratio was measured by an ordinary dc four-terminal method. The MR ratio is represented by ΔR/R where ΔR is the amount of resistance change, and R is the resistance value.

(2) Area resistivity AR ($\Omega \cdot \mu m^2$) of the device This was again measured by a dc four-terminal method.

(3) Electroconductivity (S/cm) of the spacer layer The resistivity ($\Omega \cdot cm$) of the spacer layer 40 was first found by subtracting from the area resistivity of the CPP-GMR device sample area resistivities other than the area resistivity of the spacer layer 40 to find the area resistivity of the spacer layer 40, and dividing that value by the thickness of the spacer layer 40. The electroconductivity (S/cm) of the spacer layer is then figured out in terms of the reciprocal of the resistivity ($\Omega \cdot cm$) of the spacer layer 40.

[Exemplary Setups of the Specific Samples]
(Setup of the Spacer Layer (1-1): Zn/ZnO/Zn)

The semiconductor layer 42 was made of ZnO, and the first 41, and the second nonmagnetic metal layer 43 was made of Zn. The spacer layer 40 used here is a multilayer structure of Zn/ZnO/Sn.

(1-1-1) Various device samples were prepared with the thickness t of the semiconductor layer 42 fixed at 1.0 nm but the thicknesses T11 and T22 of the first 41, and the second nonmagnetic metal layer 43 varied within the range of 0.1 nm to 0.9 nm. However, T11=T22.

Such device samples were measured for the MR ratio (%), the area resistivity AR ($\Omega \cdot \mu m^2$) of the device and (3) the electroconductivity (S/cm) of the spacer layer. The results are set out in Table 16.

TABLE 16

(Zn/ZnO/Zn)
ZnO thickness t = 1.0 nm

| Sample No. | Thickness of the first, and the second nonmagnetic metal layer T11, T22 (nm) | MR ratio (%) | Area resistivity of the device AR ($\Omega \cdot \mu m^2$) | Electroconductivity of the spacer layer (S/cm) |
|---|---|---|---|---|
| ZZ-18 | 0.10 | 0.0 | 0.1 | 133 |
| ZZ-19 | 0.15 | 4.0 | 0.1 | 133 |
| ZZ-20 | 0.20 | 6.8 | 0.1 | 133 |
| ZZ-21 | 0.25 | 8.1 | 0.1 | 133 |
| ZZ-22 | 0.30 | 8.1 | 0.1 | 133 |
| ZZ-23 | 0.40 | 8.3 | 0.1 | 133 |
| ZZ-24 | 0.50 | 8.5 | 0.1 | 133 |
| ZZ-25 | 0.60 | 8.5 | 0.1 | 133 |
| ZZ-5 | 0.70 | 8.2 | 0.1 | 133 |
| ZZ-26 | 0.80 | 6.8 | 0.1 | 133 |
| ZZ-27 | 0.85 | 6.0 | 0.1 | 133 |
| ZZ-28 | 0.90 | 0.0 | 0.1 | 133 |

From the results set out in Table 16, it is found that the thickness T11, T22 of the first and the second nonmagnetic metal layer that allows the MR ratio to be greater than 4%, a figure thought of as a defacto level in the prior art, is 0.15 to 0.85 nm. It is also found that the thickness T11, T12 of the first and the second nonmagnetic metal layer that allows the MR ratio to be greater than 8% is 0.25 to 0.70 nm.

(1-1-2) Various device samples were prepared with the thickness t of the semiconductor layer 42 fixed at 1.6 nm but the thicknesses T11 and T22 of the first 41, and the second nonmagnetic metal layer 43 varied within the range of 0.1 nm to 0.9 nm. However, T11=T22.

Such device samples were measured for the MR ratio (%), the area resistivity AR ($\Omega \cdot \mu m^2$) of the device and (3) the electroconductivity (S/cm) of the spacer layer. The results are set out in Table 17.

TABLE 17

(Zn/ZnO/Zn)
ZnO Thickness t = 1.6 nm

| Sample No. | Thickness of 1$^{st}$, and 2$^{nd}$ non-magnetic metal layer T11, T22 (nm) | MR ratio (%) | Area resistivity of the device AR ($\Omega \cdot \mu m^2$) | Electroconductivity of the spacer layer (S/cm) |
|---|---|---|---|---|
| ZZ-29 | 0.10 | 0.0 | 0.18 | 160 |
| ZZ-30 | 0.15 | 5.1 | 0.18 | 160 |
| ZZ-31 | 0.20 | 7.8 | 0.18 | 160 |
| ZZ-32 | 0.25 | 8.2 | 0.18 | 160 |
| ZZ-33 | 0.30 | 10.4 | 0.18 | 160 |
| ZZ-34 | 0.40 | 12.0 | 0.18 | 160 |
| ZZ-35 | 0.50 | 12.2 | 0.18 | 160 |
| ZZ-36 | 0.60 | 12.1 | 0.18 | 160 |
| ZZ-11 | 0.70 | 9.2 | 0.18 | 160 |
| ZZ-37 | 0.80 | 7.8 | 0.18 | 160 |
| ZZ-38 | 0.85 | 6.2 | 0.18 | 160 |
| ZZ-39 | 0.90 | 0.0 | 0.18 | 160 |

From the results set out in Table 17, it is found that the thickness T11, T22 of the first, and the second nonmagnetic metal layer that allows the MR ratio to be greater than 4%, a figure thought of as a defacto level in the prior art, is 0.15 to 0.85 nm. It is also found that the thickness T11, T12 of the first, and the second nonmagnetic metal layer that allows the MR ratio to be greater than 8% is 0.25 to 0.70 nm.

(Setup of the Spacer Layer (1-2): Ti/ZnO/Ti)

The semiconductor layer 42 was made of ZnO, and the first 41, and the second nonmagnetic metal layer 43 was made of Ti. The spacer layer 40 used here is a multilayer structure of Ti/ZnO/Ti.

(1-2-1) Various device samples were prepared with the thickness t of the semiconductor layer 42 fixed at 0.8 nm but the thicknesses T11 and T22 of the first 41, and the second nonmagnetic metal layer 43 varied within the range of 0.1 nm to 0.9 nm. However, T11=T22.

Such device samples were measured for the MR ratio (%), the area resistivity AR ($\Omega \cdot \mu m^2$) of the device and (3) the electroconductivity (S/cm) of the spacer layer. The results are set out in Table 18.

TABLE 18

(Ti/ZnO/Ti)
ZnO Thickness t = 0.8 nm

| Sample No. | Thickness of 1$^{st}$, and 2$^{nd}$ non-magnetic metal layer T11, T22 (nm) | MR ratio (%) | Area resistivity of the device AR ($\Omega \cdot \mu m^2$) | Electroconductivity of the spacer layer (S/cm) |
|---|---|---|---|---|
| TZ-15 | 0.10 | 0.0 | 0.21 | 172 |
| TZ-16 | 0.15 | 4.2 | 0.21 | 172 |
| TZ-17 | 0.20 | 4.6 | 0.21 | 172 |
| TZ-18 | 0.25 | 8.2 | 0.21 | 172 |
| TZ-19 | 0.30 | 9.2 | 0.21 | 172 |
| TZ-20 | 0.40 | 9.6 | 0.21 | 172 |
| TZ-21 | 0.50 | 9.8 | 0.21 | 172 |
| TZ-22 | 0.60 | 9.8 | 0.21 | 172 |
| TZ-5 | 0.70 | 9.6 | 0.21 | 172 |
| TZ-23 | 0.80 | 6.6 | 0.21 | 172 |

TABLE 18-continued (Ti/ZnO/Ti)
ZnO Thickness t = 0.8 nm

| Sample No. | Thickness of $1^{st}$, and $2^{nd}$ non-magnetic metal layer T11, T22 (nm) | MR ratio (%) | Area resistivity of the device AR ($\Omega \cdot \mu m^2$) | Electroconductivity of the spacer layer (S/cm) |
|---|---|---|---|---|
| TZ-24 | 0.85 | 6.2 | 0.21 | 172 |
| TZ-25 | 0.90 | 0.0 | 0.21 | 172 |

From the results set out in Table 18, it is found that the thickness T11, T22 of the first, and the second nonmagnetic metal layer that allows the MR ratio to be greater than 4%, a figure thought of as a defacto level in the prior art, is 0.15 to 0.85 nm. It is also found that the thickness T11, T12 of the first, and the second nonmagnetic metal layer that allows the MR ratio to be greater than 8% is 0.25 to 0.70 nm.

(1-2-2) Various device samples were prepared with the thickness t of the semiconductor layer 42 fixed at 1.2 nm but the thicknesses T11 and T22 of the first 41, and the second nonmagnetic metal layer 43 varied within the range of 0.1 nm to 0.9 nm. However, T11=T22.

Such device samples were measured for the MR ratio (%), the area resistivity AR ($\Omega \cdot \mu m^2$) of the device and (3) the electroconductivity (S/cm) of the spacer layer. The results are set out in Table 19.

TABLE 19

(Ti/ZnO/Ti)
ZnO Thickness t = 1.2 nm

| Sample No. | Thickness of $1^{st}$, and $2^{nd}$ non-magnetic metal layers T11, T22 (nm) | MR ratio (%) | Area resistivity of the device AR ($\Omega \cdot \mu m^2$) | Electroconductivity of the spacer layer (S/cm) |
|---|---|---|---|---|
| TZ-26 | 0.10 | 0.0 | 0.26 | 180 |
| TZ-27 | 0.15 | 6.0 | 0.26 | 180 |
| TZ-28 | 0.20 | 7.2 | 0.26 | 180 |
| TZ-29 | 0.25 | 9.3 | 0.26 | 180 |
| TZ-30 | 0.30 | 9.6 | 0.26 | 180 |
| TZ-31 | 0.40 | 10.5 | 0.26 | 180 |
| TZ-32 | 0.50 | 11.0 | 0.26 | 180 |
| TZ-33 | 0.60 | 10.5 | 0.26 | 180 |
| TZ-9 | 0.70 | 9.6 | 0.26 | 180 |
| TZ-34 | 0.80 | 7.5 | 0.26 | 180 |
| TZ-35 | 0.85 | 6.5 | 0.26 | 180 |
| TZ-36 | 0.90 | 0.0 | 0.26 | 180 |

From the results set out in Table 19, it is found that the thickness T11, T22 of the first, and the second nonmagnetic metal layer that allows the MR ratio to be greater than 4%, a figure thought of as a defacto level in the prior art, is 0.15 to 0.85 nm. It is also found that the thickness T11, T12 of the first, and the second nonmagnetic metal layer that allows the MR ratio to be greater than 8% is 0.25 to 0.70 nm.

(Setup of the Spacer Layer (1-3): V/ZnO/V)

The semiconductor layer 42 was made of ZnO, and the first 41, and the second nonmagnetic metal layer 43 was made of V. The spacer layer 40 used here is a multilayer structure of V/ZnO/V.

(1-3-1) Various device samples were prepared with the thickness t of the semiconductor layer 42 fixed at 1.2 nm but the thicknesses T11 and T22 of the first 41 and the second nonmagnetic metal layer 43 varied within the range of 0.1 nm to 0.9 nm. However, T11=T22.

Such device samples were measured for the MR ratio (%), the area resistivity AR ($\Omega \cdot \mu m^2$) of the device and (3) the electroconductivity (S/cm) of the spacer layer. The results are set out in Table 20.

TABLE 20

(V/ZnO/V)
ZnO Thickness t = 1.2 nm

| Sample No. | Thickness of $1^{st}$, and $2^{nd}$ nonmagnetic metal layer T11, T22 (nm) | MR ratio (%) | Area resistivity of the device AR ($\Omega \cdot \mu m^2$) | Electroconductivity of the spacer layer (S/cm) |
|---|---|---|---|---|
| VZ-18 | 0.10 | 0.0 | 0.18 | 160 |
| VZ-19 | 0.15 | 5.3 | 0.18 | 160 |
| VZ-20 | 0.20 | 7.9 | 0.18 | 160 |
| VZ-21 | 0.25 | 10.0 | 0.18 | 160 |
| VZ-22 | 0.30 | 11.0 | 0.18 | 160 |
| VZ-23 | 0.40 | 12.0 | 0.18 | 160 |
| VZ-24 | 0.50 | 12.0 | 0.18 | 160 |
| VZ-25 | 0.60 | 12.2 | 0.18 | 160 |
| VZ-7 | 0.70 | 12.2 | 0.18 | 160 |
| VZ-26 | 0.80 | 7.8 | 0.18 | 160 |
| VZ-27 | 0.85 | 6.9 | 0.18 | 160 |
| VZ-28 | 0.90 | 0.0 | 0.18 | 160 |

From the results set out in Table 20, it is found that the thickness T11, T22 of the first, and the second nonmagnetic metal layer that allows the MR ratio to be greater than 4%, a figure thought of as a defacto level in the prior art, is 0.15 to 0.85 nm. It is also found that the thickness T11, T12 of the first, and the second nonmagnetic metal layer that allows the MR ratio to be greater than 8% is 0.25 to 0.70 nm.

(1-3-2) Various device samples were prepared with the thickness t of the semiconductor layer 42 fixed at 1.6 nm but the thicknesses T11 and T22 of the first 41, and the second nonmagnetic metal layer 43 varied within the range of 0.1 nm to 0.9 nm. However, T11=T22.

Such device samples were measured for the MR ratio (%), the area resistivity AR ($\Omega \cdot \mu m^2$) of the device and (3) the electroconductivity (S/cm) of the spacer layer. The results are set out in Table 21.

TABLE 21

(V/ZnO/V
ZnO Thickness t = 1.6 nm

| Sample No. | Thickness of $1^{st}$, and $2^{nd}$ nonmagnetic metal layer T11, T22 (nm) | MR ratio (%) | Area resistivity of the device AR ($\Omega \cdot \mu m^2$) | Electroconductivity of the spacer layer (S/cm) |
|---|---|---|---|---|
| VZ-29 | 0.10 | 0.0 | 0.20 | 178 |
| VZ-30 | 0.15 | 6.8 | 0.20 | 178 |
| VZ-31 | 0.20 | 7.8 | 0.20 | 178 |
| VZ-32 | 0.25 | 11.0 | 0.20 | 178 |
| VZ-33 | 0.30 | 11.0 | 0.20 | 178 |

TABLE 21-continued (V/ZnO/V
ZnO Thickness t = 1.6 nm)

| Sample No. | Thickness of 1st, and 2nd nonmagnetic metal layer T11, T22 (nm) | MR ratio (%) | Area resistivity of the device AR ($\Omega \cdot \mu m^2$) | Electroconductivity of the spacer layer (S/cm) |
|---|---|---|---|---|
| VZ-34 | 0.40 | 12.0 | 0.20 | 178 |
| VZ-35 | 0.50 | 12.5 | 0.20 | 178 |
| VZ-36 | 0.60 | 12.2 | 0.20 | 178 |
| VZ-11 | 0.70 | 12.2 | 0.20 | 178 |
| VZ-37 | 0.80 | 7.9 | 0.20 | 178 |
| VZ-38 | 0.85 | 7.2 | 0.20 | 178 |
| VZ-39 | 0.90 | 0.0 | 0.20 | 178 |

From the results set out in Table 21, it is found that the thickness T11, T22 of the first, and the second nonmagnetic metal layer that allows the MR ratio to be greater than 4%, a figure thought of as a defacto level in the prior art, is 0.15 to 0.85 nm. It is also found that the thickness T11, T12 of the first, and the second nonmagnetic metal layer that allows the MR ratio to be greater than 8% is 0.25 to 0.70 nm.

(Setup of the Spacer Layer (1-4): Cr/ZnO/Cr)

The semiconductor layer 42 was made of ZnO, and the first 41, and the second nonmagnetic metal layer 43 was made of Cr. The spacer layer 40 used here is a multilayer structure of Cr/ZnO/Cr.

(1-4-1) Various device samples were prepared with the thickness t of the semiconductor layer 42 fixed at 1.6 nm but the thicknesses T11 and T22 of the first 41 and the second nonmagnetic metal layer 43 varied within the range of 0.1 nm to 0.9 nm. However, T11=T22.

Such device samples were measured for the MR ratio (%), the area resistivity AR ($\Omega \cdot \mu m^2$) of the device and (3) the electroconductivity (S/cm) of the spacer layer. The results are set out in Table 22.

TABLE 22

(Cr/ZnO/Cr
ZnO Thickness t = 1.6 nm)

| Sample No. | Thickness of 1st, and 2nd nonmagnetic metal layer T11, T22 (nm) | MR ratio (%) | Area resistivity of the device AR ($\Omega \cdot \mu m^2$) | Electroconductivity of the spacer layer (S/cm) |
|---|---|---|---|---|
| CZ-14 | 0.10 | 0.0 | 0.28 | 249 |
| CZ-15 | 0.15 | 6.6 | 0.28 | 249 |
| CZ-16 | 0.20 | 7.9 | 0.28 | 249 |
| CZ-17 | 0.25 | 12.2 | 0.28 | 249 |
| CZ-18 | 0.30 | 12.2 | 0.28 | 249 |
| CZ-19 | 0.40 | 12.5 | 0.28 | 249 |
| CZ-20 | 0.50 | 12.5 | 0.28 | 249 |
| CZ-21 | 0.60 | 12.5 | 0.28 | 249 |
| CZ-5 | 0.70 | 12.2 | 0.28 | 249 |
| CZ-22 | 0.80 | 7.8 | 0.28 | 249 |
| CZ-23 | 0.85 | 6.5 | 0.28 | 249 |
| CZ-24 | 0.90 | 0.0 | 0.28 | 249 |

From the results set out in Table 22, it is found that the thickness T11, T22 of the first, and the second nonmagnetic metal layer that allows the MR ratio to be greater than 4%, a figure thought of as a defacto level in the prior art, is 0.15 to 0.85 nm. It is also found that the thickness T11, T12 of the first, and the second nonmagnetic metal layer that allows the MR ratio to be greater than 8% is 0.25 to 0.70 nm.

(1-4-2) Various device samples were prepared with the thickness t of the semiconductor layer 42 fixed at 2.0 nm but the thicknesses T11 and T22 of the first 41 and the second nonmagnetic metal layer 43 varied within the range of 0.1 nm to 0.9 nm. However, T11=T22.

Such device samples were measured for the MR ratio (%), the area resistivity AR ($\Omega \cdot \mu m^2$) of the device and (3) the electroconductivity (S/cm) of the spacer layer. The results are set out in Table 23.

TABLE 23

(Cr/ZnO/Cr
ZnO Thickness t = 2.0 nm)

| Sample No. | Thickness of 1st, and 2nd nonmagnetic metal layer T11, T22 (nm) | MR ratio (%) | Area resistivity of the device AR ($\Omega \cdot \mu m^2$) | Electroconductivity of the spacer layer (S/cm) |
|---|---|---|---|---|
| CZ-25 | 0.10 | 0.0 | 0.28 | 249 |
| CZ-26 | 0.15 | 6.6 | 0.28 | 249 |
| CZ-27 | 0.20 | 7.9 | 0.28 | 249 |
| CZ-28 | 0.25 | 12.2 | 0.28 | 249 |
| CZ-29 | 0.30 | 12.2 | 0.28 | 249 |
| CZ-30 | 0.40 | 12.5 | 0.28 | 249 |
| CZ-31 | 0.50 | 12.5 | 0.28 | 249 |
| CZ-32 | 0.60 | 12.5 | 0.28 | 249 |
| CZ-9 | 0.70 | 12.2 | 0.28 | 249 |
| CZ-33 | 0.80 | 7.8 | 0.28 | 249 |
| CZ-34 | 0.85 | 6.5 | 0.28 | 249 |
| CZ-35 | 0.90 | 0.0 | 0.28 | 249 |

From the results set out in Table 23, it is found that the thickness T11, T22 of the first and the second nonmagnetic metal layer that allows the MR ratio to be greater than 4%, a figure thought of as a defacto level in the prior art, is 0.15 to 0.85 nm. It is also found that the thickness T11, T12 of the first and the second nonmagnetic metal layer that allows the MR ratio to be greater than 8% is 0.25 to 0.70 nm.

(Setup of the Spacer Layer (2-1): Cu/ZnS/Cu)

The semiconductor layer 42 was made of ZnS, and the first 41, and the second nonmagnetic metal layer 43 was made of Cu. The spacer layer 40 used here is a multilayer structure of Cu/ZnS/Cu.

(2-1-1) Various device samples were prepared with the thickness t of the semiconductor layer 42 fixed at 1.2 nm but the thicknesses T11 and T22 of the first 41 and the second nonmagnetic metal layer 43 varied within the range of 0.1 nm to 0.9 nm. However, T11=T22.

Such device samples were measured for the MR ratio (%), the area resistivity AR ($\Omega \cdot \mu m^2$) of the device and (3) the electroconductivity (S/cm) of the spacer layer. The results are set out in Table 24.

TABLE 24

(Cu/ZnS/Cu
ZnS Thickness t = 1.2 nm)

| Sample No. | Thickness of 1st, and 2nd nonmagnetic metal layer T11, T22 (nm) | MR ratio (%) | Area resistivity of the device AR ($\Omega \cdot \mu m^2$) | Electroconductivity of the spacer layer (S/cm) |
|---|---|---|---|---|
| CS-15 | 0.10 | 0.0 | 0.26 | 231 |
| CS-16 | 0.15 | 6.3 | 0.26 | 231 |
| CS-17 | 0.20 | 7.2 | 0.26 | 231 |
| CS-18 | 0.25 | 11.2 | 0.26 | 231 |

TABLE 24-continued (Cu/ZnS/Cu)
ZnS Thickness t = 1.2 nm

| Sample No. | Thickness of $1^{st}$, and $2^{nd}$ nonmagnetic metal layer T11, T22 (nm) | MR ratio (%) | Area resistivity of the device AR ($\Omega \cdot \mu m^2$) | Electroconductivity of the spacer layer (S/cm) |
|---|---|---|---|---|
| CS-19 | 0.30 | 11.2 | 0.26 | 231 |
| CS-20 | 0.40 | 11.5 | 0.26 | 231 |
| CS-21 | 0.50 | 12.5 | 0.26 | 231 |
| CS-22 | 0.60 | 12.5 | 0.26 | 231 |
| CS-5  | 0.70 | 11.2 | 0.26 | 231 |
| CS-23 | 0.80 | 7.4  | 0.26 | 231 |
| CS-24 | 0.85 | 6.1  | 0.26 | 231 |
| CS-25 | 0.90 | 0.0  | 0.26 | 231 |

From the results set out in Table 24, it is found that the thickness T11, T22 of the first, and the second nonmagnetic metal layer that allows the MR ratio to be greater than 4%, a figure thought of as a defacto level in the prior art, is 0.15 to 0.85 nm. It is also found that the thickness T11, T12 of the first, and the second nonmagnetic metal layer that allows the MR ratio to be greater than 8% is 0.25 to 0.70 nm.

(2-1-2) Various device samples were prepared with the thickness t of the semiconductor layer 42 fixed at 1.6 nm but the thicknesses T11 and T22 of the first 41, and the second nonmagnetic metal layer 43 varied within the range of 0.1 nm to 0.9 nm. However, T11=T22.

Such device samples were measured for the MR ratio (%), the area resistivity AR ($\Omega \cdot \mu m^2$) of the device and (3) the electroconductivity (S/cm) of the spacer layer. The results are set out in Table 25.

TABLE 25

(Cu/ZnS/Cu)
ZnS Thickness t = 1.6 nm

| Sample No. | Thickness of $1^{st}$, and $2^{nd}$ nonmagnetic meal layer T11, T22 (nm) | MR ratio (%) | Area resistivity of the device AR ($\Omega \cdot \mu m^2$) | Electroconductivity of the spacer layer (S/cm) |
|---|---|---|---|---|
| CS-26 | 0.10 | 0.0  | 0.28 | 249 |
| CS-27 | 0.15 | 6.3  | 0.28 | 249 |
| CS-28 | 0.20 | 7.2  | 0.28 | 249 |
| CS-29 | 0.25 | 11.2 | 0.28 | 249 |
| CS-30 | 0.30 | 11.2 | 0.28 | 249 |
| CS-31 | 0.40 | 11.5 | 0.28 | 249 |
| CS-32 | 0.50 | 12.5 | 0.28 | 249 |
| CS-33 | 0.60 | 12.5 | 0.28 | 249 |
| CS-9  | 0.70 | 11.2 | 0.28 | 249 |
| CS-34 | 0.80 | 7.4  | 0.28 | 249 |
| CS-35 | 0.85 | 6.1  | 0.28 | 249 |
| CS-36 | 0.90 | 0.0  | 0.28 | 249 |

From the results set out in Table 25, it is found that the thickness T11, T22 of the first, and the second nonmagnetic metal layer that allows the MR ratio to be greater than 4%, a figure thought of as a defacto level in the prior art, is 0.15 to 0.85 nm. It is also found that the thickness T11, T12 of the first, and the second nonmagnetic metal layer that allows the MR ratio to be greater than 8% is 0.25 to 0.70 nm.

(Setup of the Spacer Layer (2-2): Ag/ZnS/Ag)

The semiconductor layer 42 was made of ZnS, and the first 41, and the second nonmagnetic metal layer 43 was made of Ag. The spacer layer 40 used here is a multilayer structure of Ag/ZnS/Ag.

(2-2-1) Various device samples were prepared with the thickness t of the semiconductor layer 42 fixed at 1.0 nm but the thicknesses T11 and T22 of the first 41 and the second nonmagnetic metal layer 43 varied within the range of 0.1 nm to 0.9 nm. However, T11=T22.

Such device samples were measured for the MR ratio (%), the area resistivity AR ($\Omega \cdot \mu m^2$) of the device and (3) the electroconductivity (S/cm) of the spacer layer. The results are set out in Table 26.

TABLE 26

(Ag/ZnS/Ag)
ZnS Thickness t = 1.0 nm

| Sample No. | Thickness of $1^{st}$, and $2^{nd}$ nonmagnetic metal layer T11, T22 (nm) | MR ratio (%) | Area resistivity of the device AR ($\Omega \cdot \mu m^2$) | Electroconductivity of the spacer layer (S/cm) |
|---|---|---|---|---|
| AS-14 | 0.10 | 0.0  | 0.21 | 187 |
| AS-15 | 0.15 | 7.1  | 0.21 | 187 |
| AS-16 | 0.20 | 7.9  | 0.21 | 187 |
| AS-17 | 0.25 | 10.0 | 0.21 | 187 |
| AS-18 | 0.30 | 10.2 | 0.21 | 187 |
| AS-19 | 0.40 | 10.5 | 0.21 | 187 |
| AS-20 | 0.50 | 10.5 | 0.21 | 187 |
| AS-21 | 0.60 | 10.5 | 0.21 | 187 |
| AS-5  | 0.70 | 10.2 | 0.21 | 187 |
| AS-22 | 0.80 | 7.4  | 0.21 | 187 |
| AS-23 | 0.85 | 5.2  | 0.21 | 187 |
| AS-24 | 0.90 | 0.0  | 0.21 | 187 |

From the results set out in Table 26, it is found that the thickness T11, T22 of the first, and the second nonmagnetic metal layer that allows the MR ratio to be greater than 4%, a figure thought of as a defacto level in the prior art, is 0.15 to 0.85 nm. It is also found that the thickness T11, T12 of the first, and the second nonmagnetic metal layer that allows the MR ratio to be greater than 8% is 0.25 to 0.70 nm.

(2-2-2) Various device samples were prepared with the thickness t of the semiconductor layer 42 fixed at 1.4 nm but the thicknesses T11 and T22 of the first 41 and the second nonmagnetic metal layer 43 varied within the range of 0.1 nm to 0.9 nm. However, T11=T22.

Such device samples were measured for the MR ratio (%), the area resistivity AR ($\Omega \cdot \mu m^2$) of the device and (3) the electroconductivity (S/cm) of the spacer layer. The results are set out in Table 27.

TABLE 27

(Ag/ZnS/Ag)
ZnS Thickness t = 1.4 nm

| Sample No. | Thickness of $1^{st}$, and $2^{nd}$ nonmagnetic metal layer T11, T22 (nm) | MR ratio (%) | Area resistivity of the device AR ($\Omega \cdot \mu m^2$) | Electroconductivity of the spacer layer (S/cm) |
|---|---|---|---|---|
| AS-25 | 0.10 | 0.0  | 0.22 | 196 |
| AS-26 | 0.15 | 7.1  | 0.22 | 196 |
| AS-27 | 0.20 | 7.9  | 0.22 | 196 |
| AS-28 | 0.25 | 10.0 | 0.22 | 196 |
| AS-29 | 0.30 | 10.2 | 0.22 | 196 |
| AS-30 | 0.40 | 10.5 | 0.22 | 196 |
| AS-31 | 0.50 | 10.5 | 0.22 | 196 |
| AS-32 | 0.60 | 10.5 | 0.22 | 196 |
| AS-9  | 0.70 | 10.2 | 0.22 | 196 |
| AS-33 | 0.80 | 7.4  | 0.22 | 196 |

TABLE 27-continued (Ag/ZnS/Ag)
ZnS Thickness t = 1.4 nm

| Sample No. | Thickness of $1^{st}$, and $2^{nd}$ nonmagnetic metal layer T11, T22 (nm) | MR ratio (%) | Area resistivity of the device AR ($\Omega \cdot \mu m^2$) | Electroconductivity of the spacer layer (S/cm) |
|---|---|---|---|---|
| AS-34 | 0.85 | 5.2 | 0.22 | 196 |
| AS-35 | 0.90 | 0.0 | 0.22 | 196 |

From the results set out in Table 27, it is found that the thickness T11, T22 of the first, and the second nonmagnetic metal layer that allows the MR ratio to be greater than 4%, a figure thought of as a defacto level in the prior art, is 0.15 to 0.85 nm. It is also found that the thickness T11, T12 of the first, and the second nonmagnetic metal layer that allows the MR ratio to be greater than 8% is 0.25 to 0.70 nm.

(Setup of the Spacer Layer (2-3): Au/ZnS/Au)

The semiconductor layer 42 was made of ZnS, and the first 41, and the second nonmagnetic metal layer 43 was made of Au. The spacer layer 40 used here is a multilayer structure of Au/ZnS/Au.

(2-3-1) Various device samples were prepared with the thickness t of the semiconductor layer 42 fixed at 1.2 nm but the thicknesses T11 and T22 of the first 41 and the second nonmagnetic metal layer 43 varied within the range of 0.1 nm to 0.9 nm. However, T11=T22.

Such device samples were measured for the MR ratio (%), the area resistivity AR ($\Omega \cdot \mu m^2$) of the device and (3) the electroconductivity (S/cm) of the spacer layer. The results are set out in Table 28.

TABLE 28

(Au/ZnS/Au)
ZnS Thickness t = 1.2 nm

| Sample No. | Thickness of $1^{st}$, and $2^{nd}$ nonmagnetic metal layer T11, T22 (nm) | MR ratio (%) | Area resistivity of the device AR ($\Omega \cdot \mu m^2$) | Electroconductivity of the spacer layer (S/cm) |
|---|---|---|---|---|
| US-14 | 0.10 | 0.0 | 0.19 | 169 |
| US-15 | 0.15 | 7.1 | 0.19 | 169 |
| US-16 | 0.20 | 7.9 | 0.19 | 169 |
| US-17 | 0.25 | 11.0 | 0.19 | 169 |
| US-18 | 0.30 | 11.2 | 0.19 | 169 |
| US-19 | 0.40 | 11.5 | 0.19 | 169 |
| US-20 | 0.50 | 11.5 | 0.19 | 169 |
| US-21 | 0.60 | 11.5 | 0.19 | 169 |
| US-5 | 0.70 | 11.2 | 0.19 | 169 |
| US-22 | 0.80 | 7.4 | 0.19 | 169 |
| US-23 | 0.85 | 5.2 | 0.19 | 169 |
| US-24 | 0.90 | 0.0 | 0.19 | 169 |

From the results set out in Table 28, it is found that the thickness T11, T22 of the first, and the second nonmagnetic metal layer that allows the MR ratio to be greater than 4%, a figure thought of as a defacto level in the prior art, is 0.15 to 0.85 nm. It is also found that the thickness T11, T12 of the first, and the second nonmagnetic metal layer that allows the MR ratio to be greater than 8% is 0.25 to 0.70 nm.

(2-3-2) Various device samples were prepared with the thickness t of the semiconductor layer 42 fixed at 1.6 nm but the thicknesses T11 and T22 of the first 41 and the second nonmagnetic metal layer 43 varied within the range of 0.1 nm to 0.9 nm. However, T11=T22.

Such device samples were measured for the MR ratio (%), the area resistivity AR ($\Omega \cdot \mu m^2$) of the device and (3) the electroconductivity (S/cm) of the spacer layer. The results are set out in Table 29.

TABLE 29

(Au/ZnS/Au)
ZnS Thickness t = 1.6 nm

| Sample No. | Thickness of $1^{st}$, and $2^{nd}$ nonmagnetic metal layer T11, T22 (nm) | MR ratio (%) | Area resistivity of the device AR ($\Omega \cdot \mu m^2$) | Electroconductivity of the spacer layer (S/cm) |
|---|---|---|---|---|
| US-25 | 0.10 | 0.0 | 0.20 | 178 |
| US-26 | 0.15 | 6.6 | 0.20 | 178 |
| US-27 | 0.20 | 7.9 | 0.20 | 178 |
| US-28 | 0.25 | 11.5 | 0.20 | 178 |
| US-29 | 0.30 | 11.5 | 0.20 | 178 |
| US-30 | 0.40 | 12.0 | 0.20 | 178 |
| US-31 | 0.50 | 12.0 | 0.20 | 178 |
| US-32 | 0.60 | 12.0 | 0.20 | 178 |
| US-9 | 0.70 | 11.2 | 0.20 | 178 |
| US-33 | 0.80 | 7.8 | 0.20 | 178 |
| US-34 | 0.85 | 6.5 | 0.20 | 178 |
| US-35 | 0.90 | 0.0 | 0.20 | 178 |

From the results set out in Table 29, it is found that the thickness T11, T22 of the first, and the second nonmagnetic metal layer that allows the MR ratio to be greater than 4%, a figure thought of as a defacto level in the prior art, is 0.15 to 0.85 nm. It is also found that the thickness T11, T12 of the first, and the second nonmagnetic metal layer that allows the MR ratio to be greater than 8% is 0.25 to 0.70 nm.

(Setup of the Spacer Layer (2-4): CuZn/ZnS/CuZn)

The semiconductor layer 42 was made of ZnS, and the first 41, and the second nonmagnetic metal layer 43 was made of CuZn. The spacer layer 40 used here is a multilayer structure of CuZn/ZnS/CuZn.

(2-4-1) Various device samples were prepared with the thickness t of the semiconductor layer 42 fixed at 1.2 nm but the thicknesses T11 and T22 of the first 41 and the second nonmagnetic metal layer 43 varied within the range of 0.1 nm to 0.9 nm. However, T11=T22.

Such device samples were measured for the MR ratio (%), the area resistivity AR ($\Omega \cdot \mu m^2$) of the device and (3) the electroconductivity (S/cm) of the spacer layer. The results are set out in Table 30.

TABLE 30

(CuZn/ZnS/CuZn)
ZnS Thickness t = 1.2 nm

| Sample No. | Thickness of $1^{st}$, and $2^{nd}$ nonmagnetic metal layer T11, T22 (nm) | MR ratio (%) | Area resistivity of the device AR ($\Omega \cdot \mu m^2$) | Electroconductivity of the spacer layer (S/cm) |
|---|---|---|---|---|
| CZS-14 | 0.10 | 0.0 | 0.21 | 178 |
| CZS-15 | 0.15 | 7.7 | 0.21 | 178 |
| CZS-16 | 0.20 | 7.9 | 0.21 | 178 |
| CZS-17 | 0.25 | 12.0 | 0.21 | 178 |
| CZS-18 | 0.30 | 12.0 | 0.21 | 178 |
| CZS-19 | 0.40 | 12.5 | 0.21 | 178 |
| CZS-20 | 0.50 | 13.0 | 0.21 | 178 |
| CZS-21 | 0.60 | 13.0 | 0.21 | 178 |

TABLE 30-continued (CuZn/ZnS/CuZn)
ZnS Thickness t = 1.2 nm

| Sample No. | Thickness of $1^{st}$, and $2^{nd}$ nonmagnetic metal layer T11, T22 (nm) | MR ratio (%) | Area resistivity of the device AR ($\Omega \cdot \mu m^2$) | Electroconductivity of the spacer layer (S/cm) |
|---|---|---|---|---|
| CZS-5 | 0.70 | 12.0 | 0.21 | 178 |
| CZS-22 | 0.80 | 7.8 | 0.21 | 178 |
| CZS-23 | 0.85 | 7.5 | 0.21 | 178 |
| CZS-24 | 0.90 | 0.0 | 0.21 | 178 |

From the results set out in Table 30, it is found that the thickness T11, T22 of the first, and the second nonmagnetic metal layer that allows the MR ratio to be greater than 4%, a figure thought of as a defacto level in the prior art, is 0.15 to 0.85 nm. It is also found that the thickness T11, T12 of the first, and the second nonmagnetic metal layer that allows the MR ratio to be greater than 8% is 0.25 to 0.70 nm.

(2-4-2) Various device samples were prepared with the thickness t of the semiconductor layer 42 fixed at 1.6 nm but the thicknesses T11 and T22 of the first 41 and the second nonmagnetic metal layer 43 varied within the range of 0.1 nm to 0.9 nm. However, T11=T22.

Such device samples were measured for the MR ratio (%), the area resistivity AR ($\Omega \cdot \mu m^2$) of the device and (3) the electroconductivity (S/cm) of the spacer layer. The results are set out in Table 31.

TABLE 31

(CuZn/ZnS/CuZn)
ZnS Thickness t = 1.6 nm

| Sample No. | Thickness of $1^{st}$, and $2^{nd}$ nonmagnetic metal layer T11, T22 (nm) | MR ratio (%) | Area resistivity of the device AR ($\Omega \cdot \mu m^2$) | Electroconductivity of the spacer layer (S/cm) |
|---|---|---|---|---|
| CZS-25 | 0.10 | 0.0 | 0.21 | 187 |
| CZS-26 | 0.15 | 7.7 | 0.21 | 187 |
| CZS-27 | 0.20 | 7.9 | 0.21 | 187 |
| CZS-28 | 0.25 | 12.0 | 0.21 | 187 |
| CZS-29 | 0.30 | 12.5 | 0.21 | 187 |
| CZS-30 | 0.40 | 12.5 | 0.21 | 187 |
| CZS-31 | 0.50 | 13.5 | 0.21 | 187 |
| CZS-32 | 0.60 | 13.5 | 0.21 | 187 |
| CZS-9 | 0.70 | 12.0 | 0.21 | 187 |
| CZS-33 | 0.80 | 7.8 | 0.21 | 187 |
| CZS-34 | 0.85 | 7.5 | 0.21 | 187 |
| CZS-35 | 0.90 | 0.0 | 0.21 | 187 |

From the results set out in Table 31, it is found that the thickness T11, T22 of the first, and the second nonmagnetic metal layer that allows the MR ratio to be greater than 4%, a figure thought of as a defacto level in the prior art, is 0.15 to 0.85 nm. It is also found that the thickness T11, T12 of the first, and the second nonmagnetic metal layer that allows the MR ratio to be greater than 8% is 0.25 to 0.70 nm.

(Setup of the Spacer Layer (2-5): Zn/ZnS/Zn)

The semiconductor layer 42 was made of ZnS, and the first 41, and the second nonmagnetic metal layer 43 was made of Zn. The spacer layer 40 used here is a multilayer structure of Zn/ZnS/Zn.

(2-5-1) Various device samples were prepared with the thickness t of the semiconductor layer 42 fixed at 1.6 nm but the thicknesses T11 and T22 of the first 41 and the second nonmagnetic metal layer 43 varied within the range of 0.1 nm to 0.9 nm. However, T11=T22.

Such device samples were measured for the MR ratio (%), the area resistivity AR ($\Omega \cdot \mu m^2$) of the device and (3) the electroconductivity (S/cm) of the spacer layer. The results are set out in Table 32.

TABLE 32

(Zn/ZnS/Zn)
ZnS Thickness t = 1.6 nm

| Sample No. | Thickness of $1^{st}$, and $2^{nd}$ nonmagnetic metal layer T11, T22 (nm) | MR ratio (%) | Area resistivity of the device AR ($\Omega \cdot \mu m^2$) | Electroconductivity of the spacer layer (S/cm) |
|---|---|---|---|---|
| ZS-14 | 0.10 | 0.0 | 0.19 | 169 |
| ZS-15 | 0.15 | 7.7 | 0.19 | 169 |
| ZS-16 | 0.20 | 7.9 | 0.19 | 169 |
| ZS-17 | 0.25 | 11.0 | 0.19 | 169 |
| ZS-18 | 0.30 | 11.0 | 0.19 | 169 |
| ZS-19 | 0.40 | 11.5 | 0.19 | 169 |
| ZS-20 | 0.50 | 11.5 | 0.19 | 169 |
| ZS-21 | 0.60 | 11.5 | 0.19 | 169 |
| ZS-5 | 0.70 | 11.5 | 0.19 | 169 |
| ZS-22 | 0.80 | 7.8 | 0.19 | 169 |
| ZS-23 | 0.85 | 7.5 | 0.19 | 169 |
| ZS-24 | 0.90 | 0.0 | 0.19 | 169 |

From the results set out in Table 32, it is found that the thickness T11, T22 of the first, and the second nonmagnetic metal layer that allows the MR ratio to be greater than 4%, a figure thought of as a defacto level in the prior art, is 0.15 to 0.85 nm. It is also found that the thickness T11, T12 of the first, and the second nonmagnetic metal layer that allows the MR ratio to be greater than 8% is 0.25 to 0.70 nm.

(2-5-2) Various device samples were prepared with the thickness t of the semiconductor layer 42 fixed at 2.0 nm but the thicknesses T11 and T22 of the first 41 and the second nonmagnetic metal layer 43 varied within the range of 0.1 nm to 0.9 nm. However, T11=T22.

Such device samples were measured for the MR ratio (%), the area resistivity AR ($\Omega \cdot \mu m^2$) of the device and (3) the electroconductivity (S/cm) of the spacer layer. The results are set out in Table 33.

TABLE 33

(Zn/ZnS/Zn)
ZnS Thickness t = 2.0 nm

| Sample No. | Thickness of $1^{st}$, and $2^{nd}$ nonmagnetic metal layer T11, T22 (nm) | MR ratio (%) | Area resistivity of the device AR ($\Omega \cdot \mu m^2$) | Electroconductivity of the spacer laeyr (S/cm) |
|---|---|---|---|---|
| ZS-25 | 0.10 | 0.0 | 0.20 | 178 |
| ZS-26 | 0.15 | 7.7 | 0.20 | 178 |
| ZS-27 | 0.20 | 7.9 | 0.20 | 178 |
| ZS-28 | 0.25 | 11.0 | 0.20 | 178 |
| ZS-29 | 0.30 | 11.5 | 0.20 | 178 |
| ZS-30 | 0.40 | 12.0 | 0.20 | 178 |
| ZS-31 | 0.50 | 12.0 | 0.20 | 178 |
| ZS-32 | 0.60 | 12.0 | 0.20 | 178 |
| ZS-9 | 0.70 | 11.5 | 0.20 | 178 |
| ZS-33 | 0.80 | 7.8 | 0.20 | 178 |
| ZS-34 | 0.85 | 7.5 | 0.20 | 178 |
| ZS-35 | 0.90 | 0.0 | 0.20 | 178 |

From the results set out in Table 33, it is found that the thickness T11, T22 of the first and the second nonmagnetic metal layer that allows the MR ratio to be greater than 4%, a figure thought of as a defacto level in the prior art, is 0.15 to 0.85 nm. It is also found that the thickness T11, T12 of the first, and the second nonmagnetic metal layer that allows the MR ratio to be greater than 8% is 0.25 to 0.70 nm.

(Setup of the Spacer Layer (3-1): Cu/GaN/Cu)

The semiconductor layer 42 was made of GaN, and the first 41, and the second nonmagnetic metal layer 43 was made of Cu. The spacer layer 40 used here is a multilayer structure of Cu/GaN/Cu.

(3-1-1) Various device samples were prepared with the thickness t of the semiconductor layer 42 fixed at 1.2 nm but the thicknesses T11 and T22 of the first 41 and the second nonmagnetic metal layer 43 varied within the range of 0.1 nm to 0.9 nm. However, T11=T22.

Such device samples were measured for the MR ratio (%), the area resistivity AR ($\Omega \cdot \mu m^2$) of the device and (3) the electroconductivity (S/cm) of the spacer layer. The results are set out in Table 34.

TABLE 34

(Cu/GaN/Cu)
GaN Thickness t = 1.2 nm

| Sample No. | Thickness of $1^{st}$, and $2^{nd}$ nonmagnetic metal layer T11, T22 (nm) | MR ratio (%) | Area resistivity of the device AR ($\Omega \cdot \mu m^2$) | Electroconductivity of the spacer layer (S/cm) |
|---|---|---|---|---|
| CG-14 | 0.10 | 0.0 | 0.27 | 240 |
| CG-15 | 0.15 | 7.7 | 0.27 | 240 |
| CG-16 | 0.20 | 7.9 | 0.27 | 240 |
| CG-17 | 0.25 | 12.0 | 0.27 | 240 |
| CG-18 | 0.30 | 12.0 | 0.27 | 240 |
| CG-19 | 0.40 | 12.0 | 0.27 | 240 |
| CG-20 | 0.50 | 13.0 | 0.27 | 240 |
| CG-21 | 0.60 | 13.0 | 0.27 | 240 |
| CG-5 | 0.70 | 12.0 | 0.27 | 240 |
| CG-22 | 0.80 | 7.8 | 0.27 | 240 |
| CG-23 | 0.85 | 7.5 | 0.27 | 240 |
| CG-24 | 0.90 | 0.0 | 0.27 | 240 |

From the results set out in Table 34, it is found that the thickness T11, T22 of the first, and the second nonmagnetic metal layer that allows the MR ratio to be greater than 4%, a figure thought of as a defacto level in the prior art, is 0.15 to 0.85 nm. It is also found that the thickness T11, T12 of the first, and the second nonmagnetic metal layer that allows the MR ratio to be greater than 8% is 0.25 to 0.70 nm.

(3-1-2) Various device samples were prepared with the thickness t of the semiconductor layer 42 fixed at 1.6 nm but the thicknesses T11 and T22 of the first 41 and the second nonmagnetic metal layer 43 varied within the range of 0.1 nm to 0.9 nm. However, T11=T22.

Such device samples were measured for the MR ratio (%), the area resistivity AR ($\Omega \cdot \mu m^2$) of the device and (3) the electroconductivity (S/cm) of the spacer layer. The results are set out in Table 35.

TABLE 35

(Cu/GaN/Cu)
GaN Thickness t = 1.6 nm

| Sample No. | Thickness of $1^{st}$, and $2^{nd}$ nonmagnetic metal layer T11, T22 (nm) | MR ratio (%) | Area resistivity of the device AR ($\Omega \cdot \mu m^2$) | Electroconductivity of the spacer layer (S/cm) |
|---|---|---|---|---|
| CG-25 | 0.10 | 0.0 | 0.28 | 249 |
| CG-26 | 0.15 | 7.7 | 0.28 | 249 |
| CG-27 | 0.20 | 7.9 | 0.28 | 249 |
| CG-28 | 0.25 | 12.0 | 0.28 | 249 |
| CG-29 | 0.30 | 12.0 | 0.28 | 249 |
| CG-30 | 0.40 | 12.0 | 0.28 | 249 |
| CG-31 | 0.50 | 13.0 | 0.28 | 249 |
| CG-32 | 0.60 | 13.0 | 0.28 | 249 |
| CG-9 | 0.70 | 12.0 | 0.28 | 249 |
| CG-33 | 0.80 | 7.8 | 0.28 | 249 |
| CG-34 | 0.85 | 7.5 | 0.28 | 249 |
| CG-35 | 0.90 | 0.0 | 0.28 | 249 |

From the results set out in Table 35, it is found that the thickness T11, T22 of the first, and the second nonmagnetic metal layer that allows the MR ratio to be greater than 4%, a figure thought of as a defacto level in the prior art, is 0.15 to 0.85 nm. It is also found that the thickness T11, T12 of the first, and the second nonmagnetic metal layer that allows the MR ratio to be greater than 8% is 0.25 to 0.70 nm.

(Setup of the Spacer Layer (3-2): Ag/GaN/Ag)

The semiconductor layer 42 was made of GaN, and the first 41, and the second nonmagnetic metal layer 43 was made of Ag. The spacer layer 40 used here is a multilayer structure of Ag/GaN/Ag.

(3-2-1) Various device samples were prepared with the thickness t of the semiconductor layer 42 fixed at 1.0 nm but the thicknesses T11 and T22 of the first 41 and the second nonmagnetic metal layer 43 varied within the range of 0.1 nm to 0.9 nm. However, T11=T22.

Such device samples were measured for the MR ratio (%), the area resistivity AR ($\Omega \cdot \mu m^2$) of the device and (3) the electroconductivity (S/cm) of the spacer layer. The results are set out in Table 36.

TABLE 36

(Ag/GaN/Ag)
GaN Thickness t = 1.0 nm

| Sample No. | Thickness of $1^{st}$, and $2^{nd}$ nonmagnetic metal layer T11, T22 (nm) | MR ratio (%) | Area resistivity of the device AR ($\Omega \cdot \mu m^2$) | Electroconductivity of the spacer layer (S/cm) |
|---|---|---|---|---|
| AG-14 | 0.10 | 0.0 | 0.29 | 258 |
| AG-15 | 0.15 | 7.7 | 0.29 | 258 |
| AG-16 | 0.20 | 7.9 | 0.29 | 258 |
| AG-17 | 0.25 | 12.0 | 0.29 | 258 |
| AG-18 | 0.30 | 12.5 | 0.29 | 258 |
| AG-19 | 0.40 | 13.0 | 0.29 | 258 |
| AG-20 | 0.50 | 13.0 | 0.29 | 258 |
| AG-21 | 0.60 | 13.0 | 0.29 | 258 |
| AG-5 | 0.70 | 12.0 | 0.29 | 258 |
| AG-22 | 0.80 | 7.8 | 0.29 | 258 |
| AG-23 | 0.85 | 7.5 | 0.29 | 258 |
| AG-24 | 0.90 | 0.0 | 0.29 | 258 |

From the results set out in Table 36, it is found that the thickness T11, T22 of the first, and the second nonmagnetic metal layer that allows the MR ratio to be greater than 4%, a figure thought of as a defacto level in the prior art, is 0.15 to 0.85 nm. It is also found that the thickness T11, T12 of the first, and the second nonmagnetic metal layer that allows the MR ratio to be greater than 8% is 0.25 to 0.70 nm.

(3-2-2) Various device samples were prepared with the thickness t of the semiconductor layer 42 fixed at 1.4 nm but the thicknesses T11 and T22 of the first 41 and the second nonmagnetic metal layer 43 varied within the range of 0.1 nm to 0.9 nm. However, T11=T22.

Such device samples were measured for the MR ratio (%), the area resistivity AR ($\Omega \cdot \mu m^2$) of the device and (3) the electroconductivity (S/cm) of the spacer layer. The results are set out in Table 37.

TABLE 37

(Ag/GaN/Ag)
GaN Thickness t = 1.4 nm

| Sample No. | Thickness of $1^{st}$, and $2^{nd}$ nonmagnetic metal layer T11, T22 (nm) | MR ratio (%) | Area resistivity of the device AR ($\Omega \cdot \mu m^2$) | Electroconductivity of the spacer layer (S/cm) |
|---|---|---|---|---|
| AG-25 | 0.10 | 0.0 | 0.29 | 258 |
| AG-26 | 0.15 | 7.7 | 0.29 | 258 |
| AG-27 | 0.20 | 7.9 | 0.29 | 258 |
| AG-28 | 0.25 | 12.0 | 0.29 | 258 |
| AG-29 | 0.30 | 12.5 | 0.29 | 258 |
| AG-30 | 0.40 | 14.0 | 0.29 | 258 |
| AG-31 | 0.50 | 14.0 | 0.29 | 258 |
| AG-32 | 0.60 | 14.0 | 0.29 | 258 |
| AG-9 | 0.70 | 14.0 | 0.29 | 258 |
| AG-33 | 0.80 | 7.8 | 0.29 | 258 |
| AG-34 | 0.85 | 7.5 | 0.29 | 258 |
| AG-35 | 0.90 | 0.0 | 0.29 | 258 |

From the results set out in Table 37, it is found that the thickness T11, T22 of the first, and the second nonmagnetic metal layer that allows the MR ratio to be greater than 4%, a figure thought of as a defacto level in the prior art, is 0.15 to 0.85 nm. It is also found that the thickness T11, T12 of the first, and the second nonmagnetic metal layer that allows the MR ratio to be greater than 8% is 0.25 to 0.70 nm.

(Setup of the Spacer Layer (3-3): Au/GaN/Au)

The semiconductor layer 42 was made of GaN, and the first 41, and the second nonmagnetic metal layer 43 was made of Au. The spacer layer 40 used here is a multilayer structure of Au/GaN/Au.

(3-3-1) Various device samples were prepared with the thickness t of the semiconductor layer 42 fixed at 0.8 nm but the thicknesses T11 and T22 of the first 41 and the second nonmagnetic metal layer 43 varied within the range of 0.1 nm to 0.9 nm. However, T11=T22.

Such device samples were measured for the MR ratio (%), the area resistivity AR ($\Omega \cdot \mu m^2$) of the device and (3) the electroconductivity (S/cm) of the spacer layer. The results are set out in Table 38.

TABLE 38

(Au/GaN/Au)
GaN Thickness t = 0.8 nm

| Sample No. | Thickness of $1^{st}$, and $2^{nd}$ nonmagnetic metal layer T11, T22 (nm) | MR ratio (%) | Area resistivity of the device AR ($\Omega \cdot \mu m^2$) | Electroconductivity of the spacer layer (S/cm) |
|---|---|---|---|---|
| UG-14 | 0.10 | 0.0 | 0.23 | 205 |
| UG-15 | 0.15 | 7.7 | 0.23 | 205 |
| UG-16 | 0.20 | 7.9 | 0.23 | 205 |
| UG-17 | 0.25 | 11.5 | 0.23 | 205 |
| UG-18 | 0.30 | 11.5 | 0.23 | 205 |
| UG-19 | 0.40 | 12.0 | 0.23 | 205 |
| UG-20 | 0.50 | 12.0 | 0.23 | 205 |
| UG-21 | 0.60 | 12.0 | 0.23 | 205 |
| UG-5 | 0.70 | 11.5 | 0.23 | 205 |
| UG-22 | 0.80 | 7.8 | 0.23 | 205 |
| UG-23 | 0.85 | 7.5 | 0.23 | 205 |
| UG-24 | 0.90 | 0.0 | 0.23 | 205 |

From the results set out in Table 38, it is found that the thickness T11, T22 of the first, and the second nonmagnetic metal layer that allows the MR ratio to be greater than 4%, a figure thought of as a defacto level in the prior art, is 0.15 to 0.85 nm. It is also found that the thickness T11, T12 of the first, and the second nonmagnetic metal layer that allows the MR ratio to be greater than 8% is 0.25 to 0.70 nm.

(3-3-2) Various device samples were prepared with the thickness t of the semiconductor layer 42 fixed at 1.2 nm but the thicknesses T11 and T22 of the first 41 and the second nonmagnetic metal layer 43 varied within the range of 0.1 nm to 0.9 nm. However, T11=T22.

Such device samples were measured for the MR ratio (%), the area resistivity AR ($\Omega \cdot \mu m^2$) of the device and (3) the electroconductivity (S/cm) of the spacer layer. The results are set out in Table 39.

TABLE 39

(Au/GaN/Au)
GaN Thickness t = 1.2 nm

| Sample No. | Thickness of $1^{st}$, and $2^{nd}$ nonmagnetic metal layer T11, T22 (nm) | MR ratio (%) | Area resistivity of the device AR ($\Omega \cdot \mu m^2$) | Electroconductivity of the spacer layer (S/cm) |
|---|---|---|---|---|
| UG-25 | 0.10 | 0.0 | 0.24 | 214 |
| UG-26 | 0.15 | 7.7 | 0.24 | 214 |
| UG-27 | 0.20 | 7.9 | 0.24 | 214 |
| UG-28 | 0.25 | 11.5 | 0.24 | 214 |
| UG-29 | 0.30 | 11.5 | 0.24 | 214 |
| UG-30 | 0.40 | 12.5 | 0.24 | 214 |
| UG-31 | 0.50 | 12.5 | 0.24 | 214 |
| UG-32 | 0.60 | 12.5 | 0.24 | 214 |
| UG-9 | 0.70 | 11.5 | 0.24 | 214 |
| UG-33 | 0.80 | 7.8 | 0.24 | 214 |
| UG-34 | 0.85 | 7.5 | 0.24 | 214 |
| UG-35 | 0.90 | 0.0 | 0.24 | 214 |

From the results set out in Table 39, it is found that the thickness T11, T22 of the first, and the second nonmagnetic metal layer that allows the MR ratio to be greater than 4%, a figure thought of as a defacto level in the prior art, is 0.15 to 0.85 nm. It is also found that the thickness T11, T12 of the first, and the second nonmagnetic metal layer that allows the MR ratio to be greater than 8% is 0.25 to 0.70 nm.

(Setup of the Spacer Layer (3-4): CuZn/GaN/CuZn)

The semiconductor layer 42 was made of GaN, and the first 41, and the second nonmagnetic metal layer 43 was made of CuZn. The spacer layer 40 used here is a multilayer structure of CuZn/GaN/CuZn.

(3-4-1) Various device samples were prepared with the thickness t of the semiconductor layer 42 fixed at 1.2 nm but the thicknesses T11 and T22 of the first 41 and the second nonmagnetic metal layer 43 varied within the range of 0.1 nm to 0.9 nm. However, T11=T22.

Such device samples were measured for the MR ratio (%), the area resistivity AR ($\Omega \cdot \mu m^2$) of the device and (3) the electroconductivity (S/cm) of the spacer layer. The results are set out in Table 40.

TABLE 40

(CuZn/GaN/CuZn)
GaN Thickness t = 1.2 nm

| Sample No. | Thickness of 1$^{st}$, and 2$^{nd}$ nonmagnetic metal layer T11, T22 (nm) | MR ratio (%) | Area resistivity of the device AR ($\Omega \cdot \mu m^2$) | Electroconductivity of the spacer layer (S/cm) |
|---|---|---|---|---|
| CZG-14 | 0.10 | 0.0 | 0.29 | 259 |
| CZG-15 | 0.15 | 7.7 | 0.29 | 259 |
| CZG-16 | 0.20 | 7.9 | 0.29 | 259 |
| CZG-17 | 0.25 | 11.5 | 0.29 | 259 |
| CZG-18 | 0.30 | 11.5 | 0.29 | 259 |
| CZG-19 | 0.40 | 12.5 | 0.29 | 259 |
| CZG-20 | 0.50 | 12.5 | 0.29 | 259 |
| CZG-21 | 0.60 | 12.5 | 0.29 | 259 |
| CZG-5 | 0.70 | 11.5 | 0.29 | 259 |
| CZG-22 | 0.80 | 7.8 | 0.29 | 259 |
| CZG-23 | 0.85 | 7.5 | 0.29 | 259 |
| CZG-24 | 0.90 | 0.0 | 0.29 | 259 |

From the results set out in Table 40, it is found that the thickness T11, T22 of the first, and the second nonmagnetic metal layer that allows the MR ratio to be greater than 4%, a figure thought of as a defacto level in the prior art, is 0.15 to 0.85 nm. It is also found that the thickness T11, T12 of the first, and the second nonmagnetic metal layer that allows the MR ratio to be greater than 8% is 0.25 to 0.70 nm.

(3-4-2) Various device samples were prepared with the thickness t of the semiconductor layer 42 fixed at 1.6 nm but the thicknesses T11 and T22 of the first 41 and the second nonmagnetic metal layer 43 varied within the range of 0.1 nm to 0.9 nm. However, T11=T22.

Such device samples were measured for the MR ratio (%), the area resistivity AR ($\Omega \cdot \mu m^2$) of the device and (3) the electroconductivity (S/cm) of the spacer layer. The results are set out in Table 41.

TABLE 41

(CuZn/GaN/CuZn)
GaN Thickness t = 1.6 nm

| Sample No. | Thickness of 1$^{st}$, and 2$^{nd}$ nonmagnetic metal layer T11, T22 (nm) | MR ratio (%) | Area resistivity of the device AR ($\Omega \cdot \mu m^2$) | Electroconductivity of the spacer layer (S/cm) |
|---|---|---|---|---|
| CZG-25 | 0.10 | 0.0 | 0.29 | 259 |
| CZG-26 | 0.15 | 7.7 | 0.29 | 259 |
| CZG-27 | 0.20 | 7.9 | 0.29 | 259 |
| CZG-28 | 0.25 | 11.5 | 0.29 | 259 |
| CZG-29 | 0.30 | 12.0 | 0.29 | 259 |
| CZG-30 | 0.40 | 13.0 | 0.29 | 259 |
| CZG-31 | 0.50 | 13.5 | 0.29 | 259 |
| CZG-32 | 0.60 | 14.0 | 0.29 | 259 |
| CZG-9 | 0.70 | 13.5 | 0.29 | 259 |
| CZG-33 | 0.80 | 7.8 | 0.29 | 259 |
| CZG-34 | 0.85 | 7.5 | 0.29 | 259 |
| CZG-35 | 0.90 | 0.0 | 0.29 | 259 |

From the results set out in Table 41, it is found that the thickness T11, T22 of the first, and the second nonmagnetic metal layer that allows the MR ratio to be greater than 4%, a figure thought of as a defacto level in the prior art, is 0.15 to 0.85 nm. It is also found that the thickness T11, T12 of the first, and the second nonmagnetic metal layer that allows the MR ratio to be greater than 8% is 0.25 to 0.70 nm.

(Setup of the Spacer Layer (3-5): Zn/GaN/Zn)

The semiconductor layer 42 was made of GaN, and the first 41, and the second nonmagnetic metal layer 43 was made of Zn. The spacer layer 40 used here is a multilayer structure of Zn/GaN/Zn.

(3-5-1) Various device samples were prepared with the thickness t of the semiconductor layer 42 fixed at 1.6 nm but the thicknesses T11 and T22 of the first 41 and the second nonmagnetic metal layer 43 varied within the range of 0.1 nm to 0.9 nm. However, T11=T22.

Such device samples were measured for the MR ratio (%), the area resistivity AR ($\Omega \cdot \mu m^2$) of the device and (3) the electroconductivity (S/cm) of the spacer layer. The results are set out in Table 42.

TABLE 42

(Zn/GaN/Zn)
GaN Thickness t = 1.6 nm

| Sample No. | Thickness of 1$^{st}$, and 2$^{nd}$ nonmagnetic metal layer T11, T22 (nm) | MR ratio (%) | Area resistivity of the device AR ($\Omega \cdot \mu m^2$) | Electroconductivity of the spacer layer (S/cm) |
|---|---|---|---|---|
| ZG-14 | 0.10 | 0.0 | 0.22 | 196 |
| ZG-15 | 0.15 | 7.7 | 0.22 | 196 |
| ZG-16 | 0.20 | 7.9 | 0.22 | 196 |
| ZG-17 | 0.25 | 11.0 | 0.22 | 196 |
| ZG-18 | 0.30 | 12.0 | 0.22 | 196 |
| ZG-19 | 0.40 | 12.0 | 0.22 | 196 |
| ZG-20 | 0.50 | 12.0 | 0.22 | 196 |
| ZG-21 | 0.60 | 12.0 | 0.22 | 196 |
| ZG-5 | 0.70 | 12.5 | 0.22 | 196 |
| ZG-22 | 0.80 | 7.8 | 0.22 | 196 |
| ZG-23 | 0.85 | 7.5 | 0.22 | 196 |
| ZG-24 | 0.90 | 0.0 | 0.22 | 196 |

From the results set out in Table 42, it is found that the thickness T11, T22 of the first, and the second nonmagnetic metal layer that allows the MR ratio to be greater than 4%, a figure thought of as a defacto level in the prior art, is 0.15 to 0.85 nm. It is also found that the thickness T11, T12 of the first, and the second nonmagnetic metal layer that allows the MR ratio to be greater than 8% is 0.25 to 0.70 nm.

(3-5-2) Various device samples were prepared with the thickness t of the semiconductor layer 42 fixed at 2.0 nm but the thicknesses T11 and T22 of the first 41 and the second nonmagnetic metal layer 43 varied within the range of 0.1 nm to 0.9 nm. However, T11=T22.

Such device samples were measured for the MR ratio (%), the area resistivity AR ($\Omega \cdot \mu m^2$) of the device and (3) the electroconductivity (S/cm) of the spacer layer. The results are set out in Table 43.

TABLE 43

(Zn/GaN/Zn)
GaN Thickness t = 2.0 nm

| Sample No. | Thickness of $1^{st}$, and $2^{nd}$ nonmagnetic metal layer T11, T22 (nm) | MR ratio (%) | Area resistivity of the device AR ($\Omega \cdot \mu m^2$) | Electroconductivity of the spacer layer (S/cm) |
|---|---|---|---|---|
| ZG-25 | 0.10 | 0.0 | 0.23 | 205 |
| ZG-26 | 0.15 | 7.7 | 0.23 | 205 |
| ZG-27 | 0.20 | 7.9 | 0.23 | 205 |
| ZG-28 | 0.25 | 11.5 | 0.23 | 205 |
| ZG-29 | 0.30 | 12.0 | 0.23 | 205 |
| ZG-30 | 0.40 | 12.5 | 0.23 | 205 |
| ZG-31 | 0.50 | 12.5 | 0.23 | 205 |
| ZG-32 | 0.60 | 12.5 | 0.23 | 205 |
| ZG-9 | 0.70 | 13.0 | 0.23 | 205 |
| ZG-33 | 0.80 | 7.8 | 0.23 | 205 |
| ZG-34 | 0.85 | 7.5 | 0.23 | 205 |
| ZG-35 | 0.90 | 0.0 | 0.23 | 205 |

From the results set out in Table 43, it is found that the thickness T11, T22 of the first, and the second nonmagnetic metal layer that allows the MR ratio to be greater than 4%, a figure thought of as a defacto level in the prior art, is 0.15 to 0.85 nm. It is also found that the thickness T11, T12 of the first, and the second nonmagnetic metal layer that allows the MR ratio to be greater than 8% is 0.25 to 0.70 nm.

It is here noted that the thicknesses T11 and T12 of the first and second nonmagnetic metal layers may be different from each other insofar as they are within the desired range of the invention.

From a series of such results as mentioned above, the advantages of the invention would be undisputed. That is to say, the thickness of the semiconductor layer forming a part of said spacer layer in the CPP-GMR device of the invention is set in the thickness range for a transitional area showing conduction performance halfway between ohmic conduction and semi-conductive conduction in relation to the junction of said semiconductor layer with the first nonmagnetic metal layer and the second nonmagnetic metal layer. This permits the specific resistance of the spacer layer to be greater than that of an ohmic conduction area, so that spin scattering and diffusion depending on a magnetized state increases much, resulting in an increase in the MR ratio. The CPP-GMR device can also have a suitable area resistivity (AR) value.

If the device can have a suitable area resistivity and a high MR ratio, it is then possible to obtain more stable output power in low current operation than ever before, and extend the service life of the device. The device is also lower in resistance than a TMR device, so that significant noise reductions are achievable.

What we claim is:

1. A giant magneto-resistive effect device (CPP-GMR device) having a CPP (current perpendicular to plane) structure comprising a spacer layer, and a fixed magnetization layer and a free layer stacked one upon another with said spacer layer interposed between them, with a sense current applied in a stacking direction, characterized in that:
   said free layer functions such that a magnetization direction changes depending on an external magnetic field, and,
   said spacer layer comprises a first nonmagnetic metal layer and a second nonmagnetic metal layer, each formed of a nonmagnetic metal material, and a semiconductor layer interposed between the first nonmagnetic metal layer and the second nonmagnetic metal layer, wherein:
   the semiconductor layer forming a part of said spacer layer has a thickness set in a thickness range for a transitional area showing conduction performance halfway between ohmic conduction and semi-conductive conduction in relation to a junction of said semiconductor layer with said first nonmagnetic metal layer and said second nonmagnetic metal layer.

2. The magneto-resistive effect device according to claim 1, wherein:
   said semiconductor layer is ZnO,
   said first nonmagnetic metal layer and said second nonmagnetic metal layer are each Zn, and
   said ZnO semiconductor layer has a thickness of 1.0 to 1.6 nm.

3. The magneto-resistive effect device according to claim 1, wherein:
   said semiconductor layer is ZnO,
   said first nonmagnetic metal layer and said second nonmagnetic metal layer are each Ti, and
   said ZnO semiconductor layer has a thickness of 0.8 to 1.2 nm.

4. The magneto-resistive effect device according to claim 1, wherein:
   said semiconductor layer is ZnO,
   said first nonmagnetic metal layer and said second nonmagnetic metal layer are each V, and,
   said ZnO semiconductor layer has a thickness of 1.2 to 1.6 nm.

5. The magneto-resistive effect device according to claim 1, wherein:
   said semiconductor layer is ZnO,
   said first nonmagnetic metal layer and said second nonmagnetic metal layer are each Cr, and,
   said ZnO semiconductor layer has a thickness of 1.6 to 2.0 nm.

6. The magneto-resistive effect device according to claim 1, wherein:
   said semiconductor layer is ZnS,
   said first nonmagnetic metal layer and said second nonmagnetic metal layer are each Cu, and
   said ZnS semiconductor layer has a thickness of 1.2 to 1.6 nm.

7. The magneto-resistive effect device according to claim 1, wherein:
   said semiconductor layer is ZnS,
   said first nonmagnetic metal layer and said second nonmagnetic metal layer are each Ag, and
   said ZnS semiconductor layer has a thickness of 1.0 to 1.4 nm.

8. The magneto-resistive effect device according to claim 1, wherein:
said semiconductor layer is ZnS,
said first nonmagnetic metal layer and said second nonmagnetic metal layer are each Au, and
said ZnS semiconductor layer has a thickness of 1.2 to 1.6 nm.

9. The magneto-resistive effect device according to claim 1, wherein:
said semiconductor layer is ZnS,
said first nonmagnetic metal layer and said second nonmagnetic metal layer are each CuZn, and
said ZnS semiconductor layer has a thickness of 1.2 to 1.6 nm.

10. The magneto-resistive effect device according to claim 1, wherein:
said semiconductor layer is ZnS,
said first nonmagnetic metal layer and said second nonmagnetic metal layer are each Zn, and
said ZnS semiconductor layer has a thickness of 1.6 to 2.0 nm.

11. The magneto-resistive effect device according to claim 1, wherein:
said semiconductor layer is GaN,
said first nonmagnetic metal layer and said second nonmagnetic metal layer are each Cu, and
said GaN semiconductor layer has a thickness of 1.2 to 1.6 nm.

12. The magneto-resistive effect device according to claim 1, wherein:
said semiconductor layer is GaN,
said first nonmagnetic metal layer and said second nonmagnetic metal layer are each Ag, and
said GaN semiconductor layer has a thickness of 1.0 to 1.4 nm.

13. The magneto-resistive effect device according to claim 1, wherein:
said semiconductor layer is GaN,
said first nonmagnetic metal layer and said second nonmagnetic metal layer are each Au, and
said GaN semiconductor layer has a thickness of 0.8 to 1.2 nm.

14. The magneto-resistive effect device according to claim 1, wherein:
said semiconductor layer is GaN,
said first nonmagnetic metal layer and said second nonmagnetic metal layer are each CuZn, and
said GaN semiconductor layer has a thickness of 1.2 to 1.6 nm.

15. The magneto-resistive effect device according to claim 1, wherein:
said semiconductor layer is GaN,
said first nonmagnetic metal layer and said second nonmagnetic metal layer are each Zn, and
said GaN semiconductor layer has a thickness of 1.6 to 2.0 nm.

16. The magneto-resistive effect device according to claim 1, wherein said first nonmagnetic metal layer, and said second nonmagnetic metal layer has a thickness of 0.15 to 0.85 nm.

17. The magneto-resistive effect device according to claim 1, wherein said first nonmagnetic metal layer, and said second nonmagnetic metal layer has a thickness of 0.25 to 0.70 nm.

18. The magneto-resistive effect device according to claim 1, which has an area resistivity of 0.1 to 0.3 $\Omega \cdot \mu m^2$.

19. The magneto-resistive effect device according to claim 1, wherein said spacer layer has an electro-conductivity of 133 to 432 (S/cm).

20. A thin-film magnetic head, characterized by comprising:
a plane opposite to a recoding medium,
a magneto-resistive effect device as recited in claim 1, which is located near said medium opposite plane for detecting a signal magnetic field from said recording medium, and
a pair of electrodes for passing currents in the stacking direction of said magneto-resistive effect device.

21. A hard disk system, characterized by comprising:
a slider including a thin-film magnetic head as recited in claim 20 and located in opposition to a recording medium, and
a positioning means adapted to support and position said slider with respect to said recording medium.

22. A head gimbal assembly, characterized by comprising:
a slider including a thin-film magnetic head as recited in claim 20 and located in opposition to a recording medium, and
a suspension adapted to resiliently support said slider.

* * * * *